United States Patent
Lin et al.

(10) Patent No.: US 12,402,383 B2
(45) Date of Patent: *Aug. 26, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiaowen Lee, Hsinchu (TW); Yu-Shan Cheng, Hsinchu (TW); Chao-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/609,982

(22) Filed: Mar. 19, 2024

(65) Prior Publication Data

US 2024/0234540 A1     Jul. 11, 2024

Related U.S. Application Data

(63) Continuation of application No. 18/158,263, filed on Jan. 23, 2023, now Pat. No. 11,961,899, which is a
(Continued)

(51) Int. Cl.
*H01L 29/66* (2006.01)
*H01L 21/764* (2006.01)
(Continued)

(52) U.S. Cl.
CPC ......... *H10D 64/015* (2025.01); *H01L 21/764* (2013.01); *H10D 30/6735* (2025.01);
(Continued)

(58) Field of Classification Search
CPC ......... H01L 21/02603; H01L 21/28141; H01L 21/764; H01L 21/7682; H01L 21/823431;
(Continued)

(56) References Cited

U.S. PATENT DOCUMENTS 11,563,105 B2 *  1/2023  Lin ..................... H10D 62/118
11,961,899 B2 *  4/2024  Lin ..................... H10D 30/024
(Continued)

OTHER PUBLICATIONS

Non-Final Office Action on U.S. Appl. No. 17/230,421 DTD Jun. 16, 2022.
(Continued)

*Primary Examiner* — David C Spalla
(74) *Attorney, Agent, or Firm* — FOLEY & LARDNER LLP

(57) ABSTRACT

A method for fabricating semiconductor devices includes forming a channel structure over a substrate and along a first lateral direction; forming a gate structure extending along a second lateral direction and straddling a portion of the channel structure; forming a gate spacer along a side of the gate structure, the gate spacer having a lateral portion and a vertical portion; growing an epitaxial structure over the channel structure; and forming an air gap within the gate spacer. The air gap is entirely above the epitaxial structure and vertically separated from the epitaxial structure by the lateral portion of the gate spacer.

20 Claims, 29 Drawing Sheets

Related U.S. Application Data continuation of application No. 17/230,421, filed on Apr. 14, 2021, now Pat. No. 11,563,105.

(51) Int. Cl.
  *H01L 29/06* (2006.01)
  *H01L 29/423* (2006.01)
  *H01L 29/786* (2006.01)
  *H10D 30/67* (2025.01)
  *H10D 62/10* (2025.01)
  *H10D 64/01* (2025.01)

(52) U.S. Cl.
  CPC ....... *H10D 30/6757* (2025.01); *H10D 62/118* (2025.01); *H10D 64/021* (2025.01)

(58) Field of Classification Search
  CPC ........... H01L 21/823821; H01L 21/845; H01L 27/0886; H01L 27/0924; H01L 27/1211; H01L 29/0649; H01L 29/0653; H01L 29/0665; H01L 29/0669; H01L 29/0673; H01L 29/41791; H01L 29/66439; H01L 29/6653; H01L 29/66553; H01L 29/6656; H01L 29/66795; H01L 29/775; H01L 29/785; H01L 29/7851; H01L 29/7853; H01L 29/7855; H01L 2029/7858; H01L 2221/1042; H01L 2221/1047
  See application file for complete search history.

(56) References Cited

U.S. PATENT DOCUMENTS

| | | | |
|---|---|---|---|
| 2015/0263122 A1* | 9/2015 | Hsiao | H01L 29/515 438/283 |
| 2018/0233398 A1* | 8/2018 | Van Cleemput | H01L 21/7682 |
| 2019/0296123 A1* | 9/2019 | Lee | H01L 21/7682 |
| 2020/0020567 A1 | 1/2020 | Sun et al. | |
| 2020/0105909 A1* | 4/2020 | Wu | H01L 29/7843 |
| 2021/0098592 A1 | 4/2021 | Kang et al. | |

OTHER PUBLICATIONS

Non-Final Office Action on U.S. Appl. No. 18/158,263 DTD Aug. 17, 2023.
Notice of Allowance on U.S. Appl. No. 17/230,421 DTD Sep. 30, 2022.
Notice of Allowance on U.S. Appl. No. 18/158,263 DTD Dec. 20, 2023.

* cited by examiner

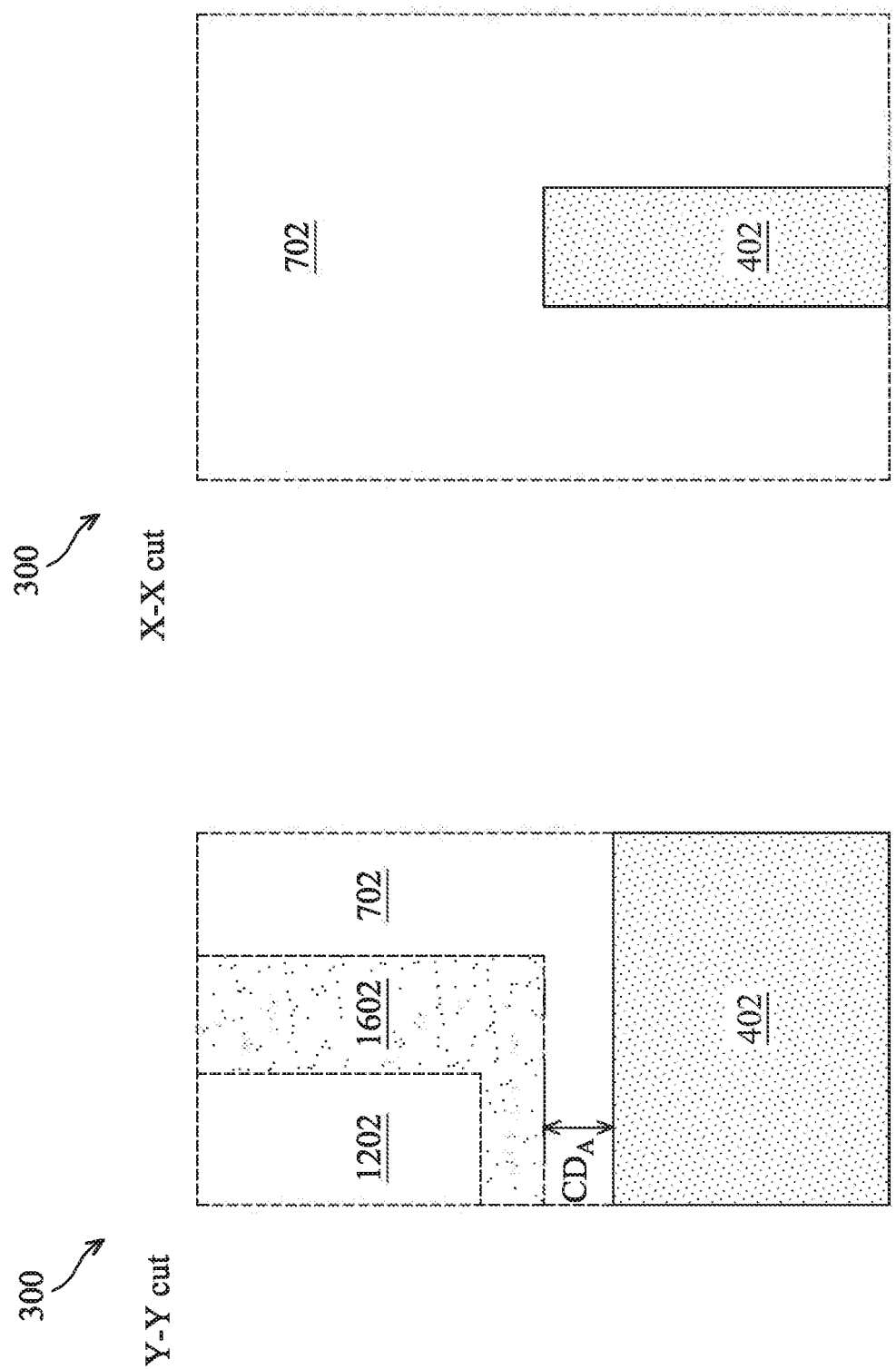

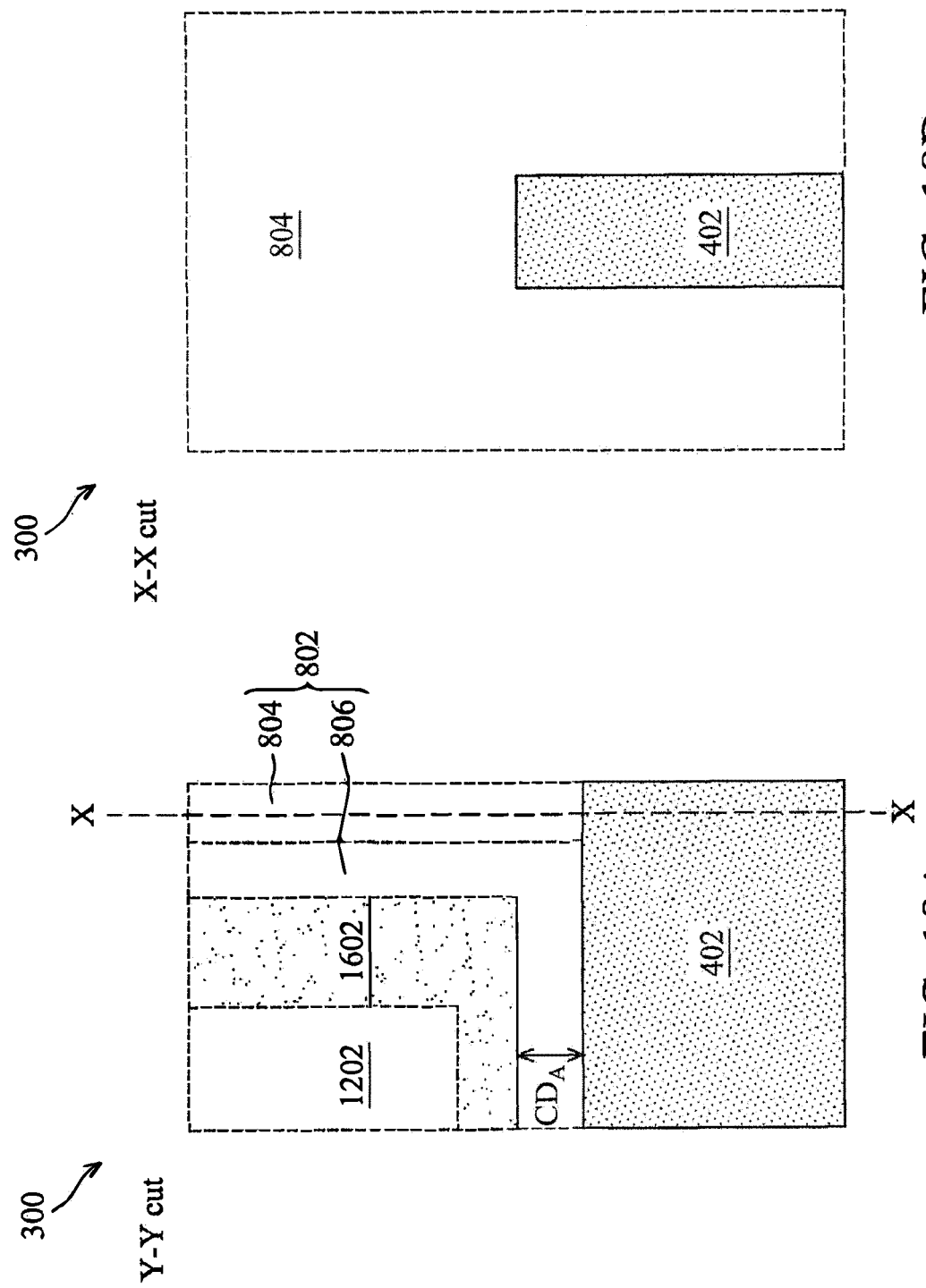

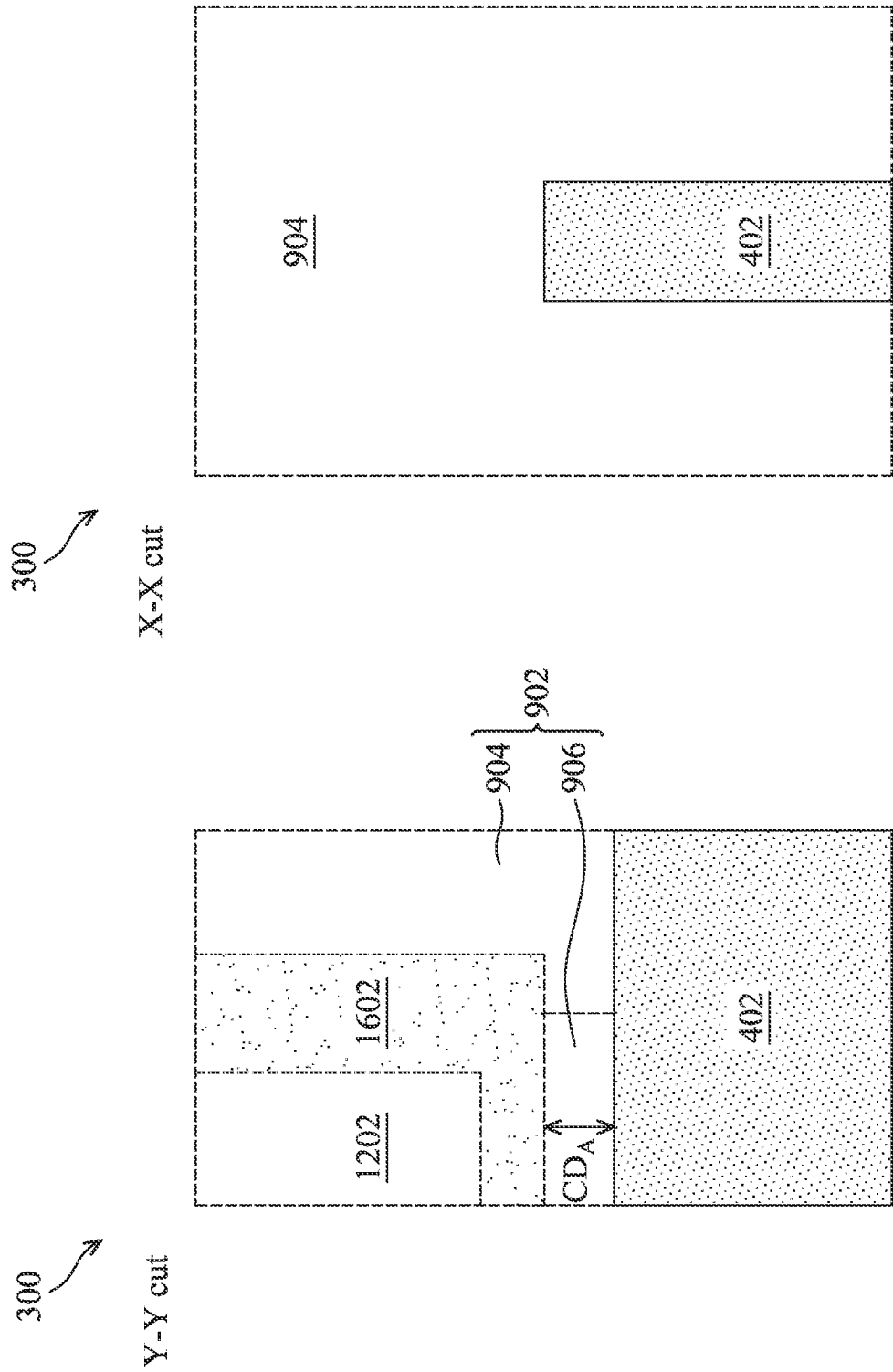

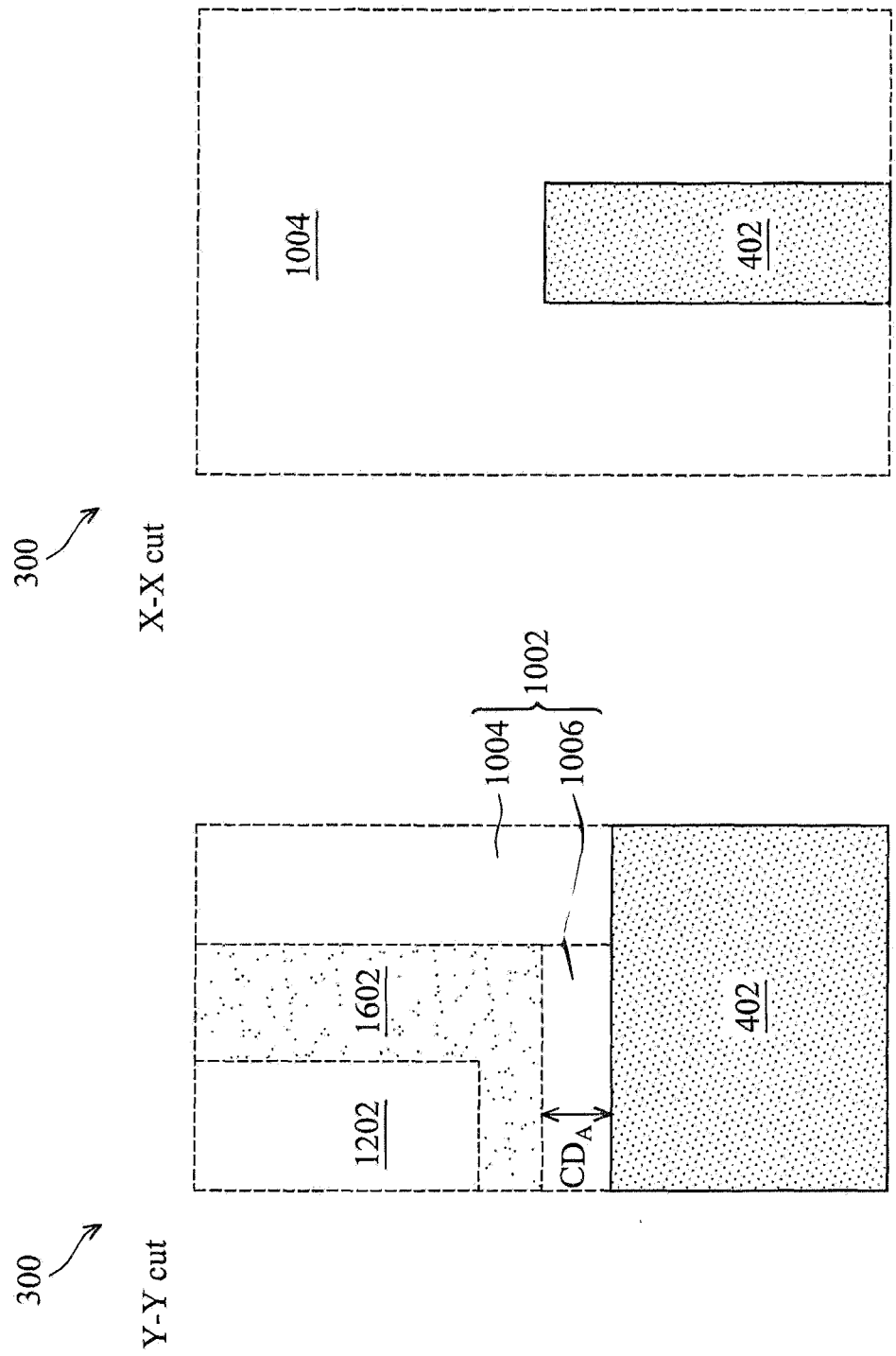

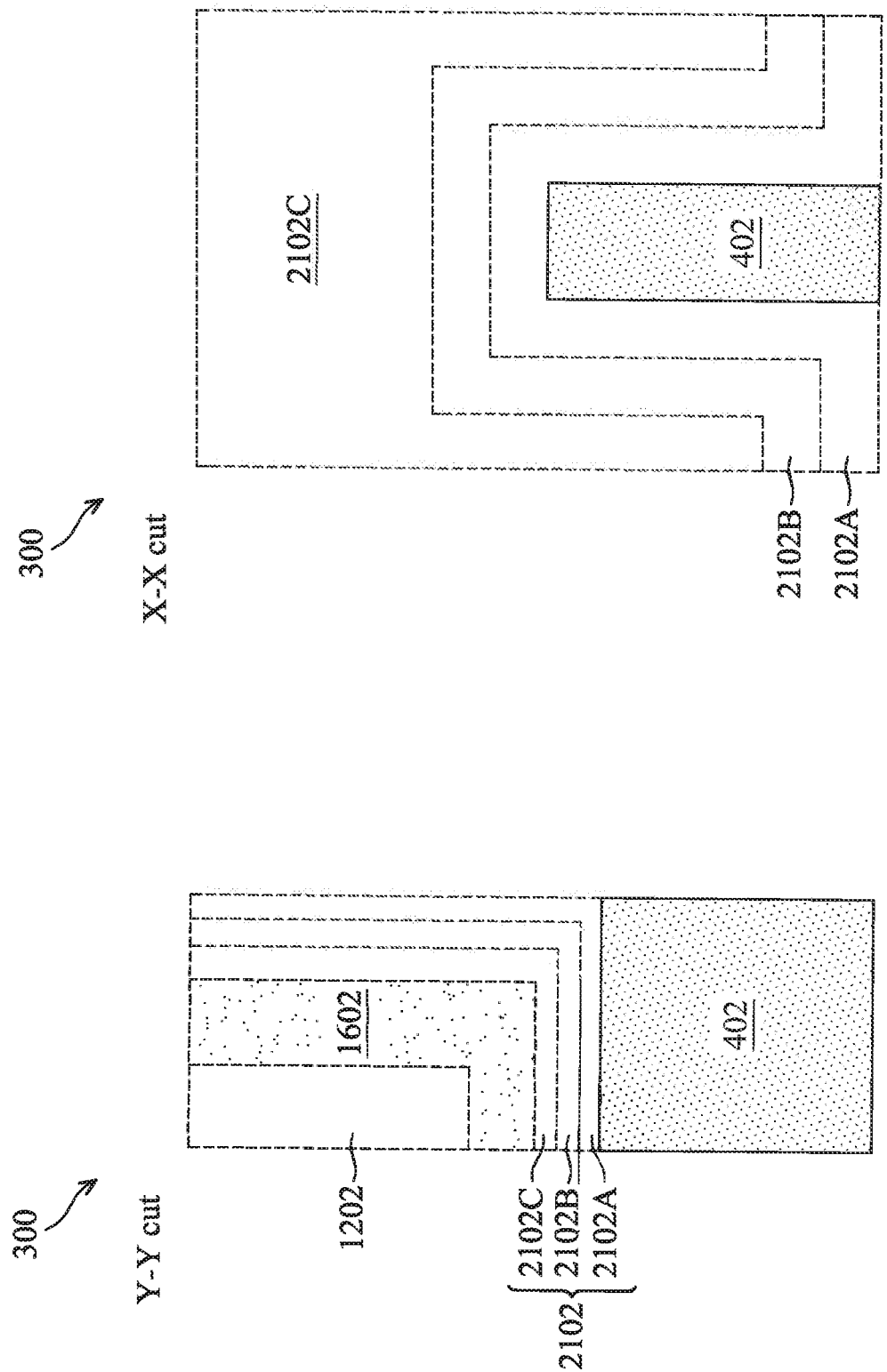

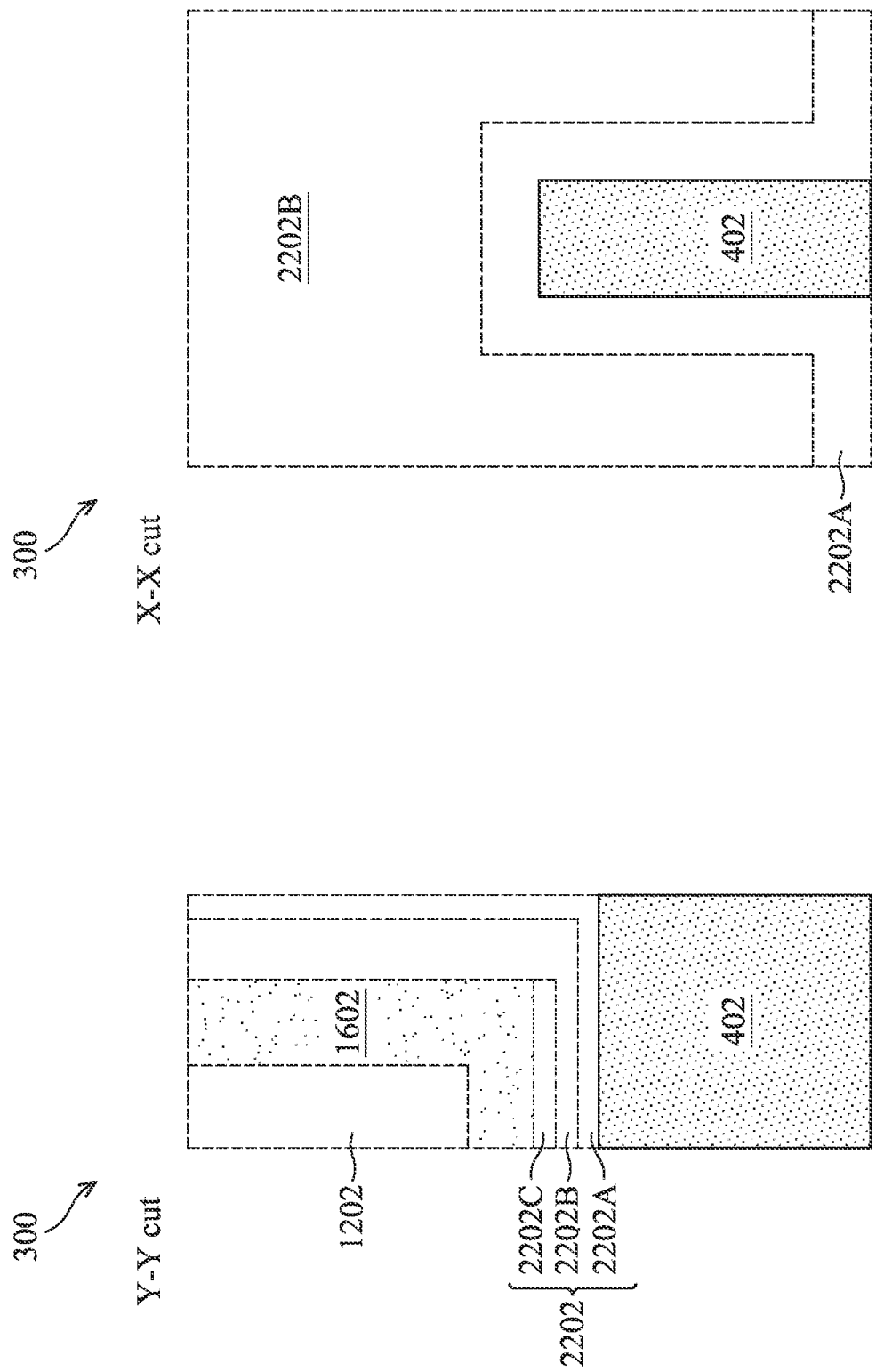

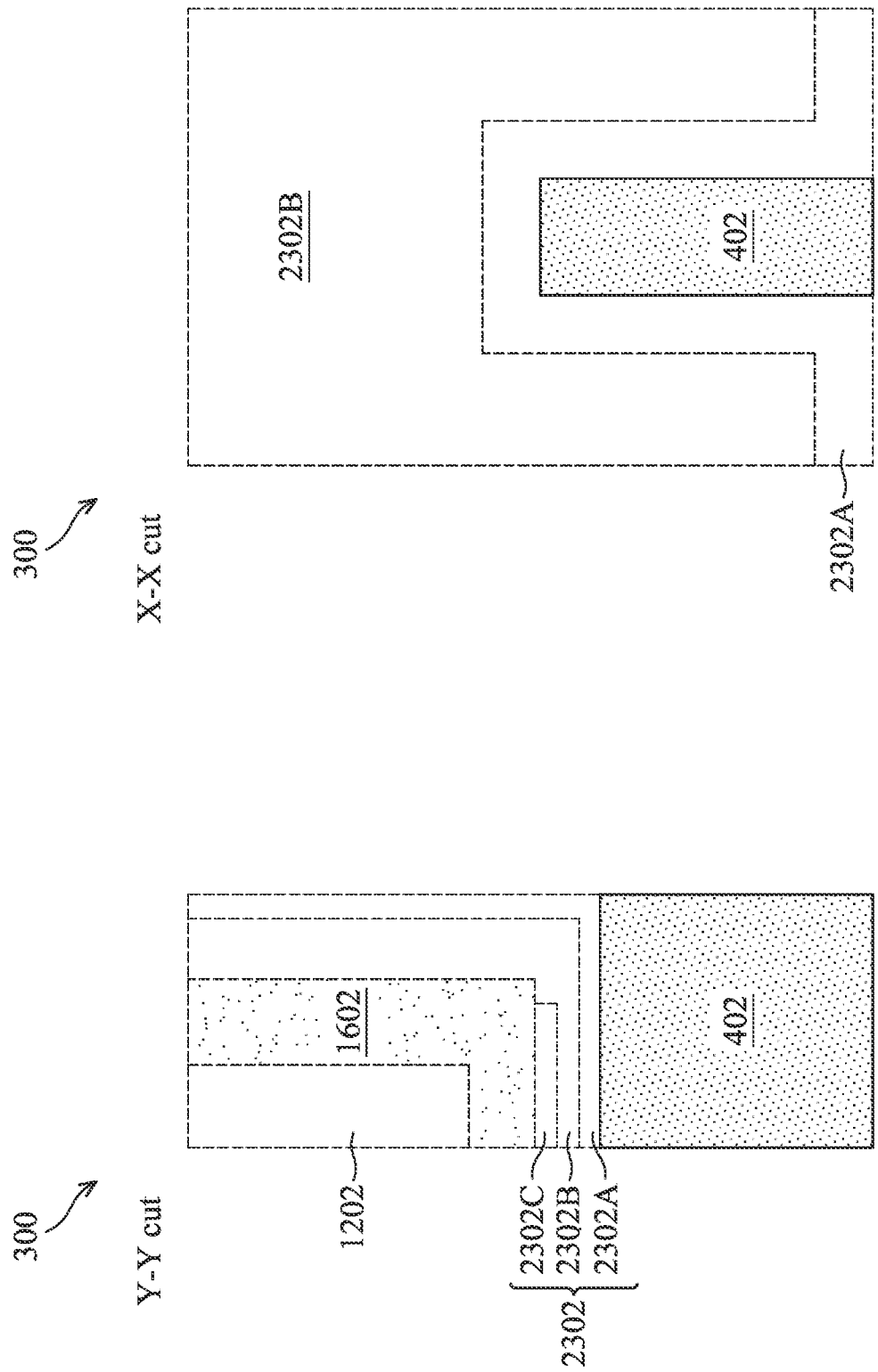

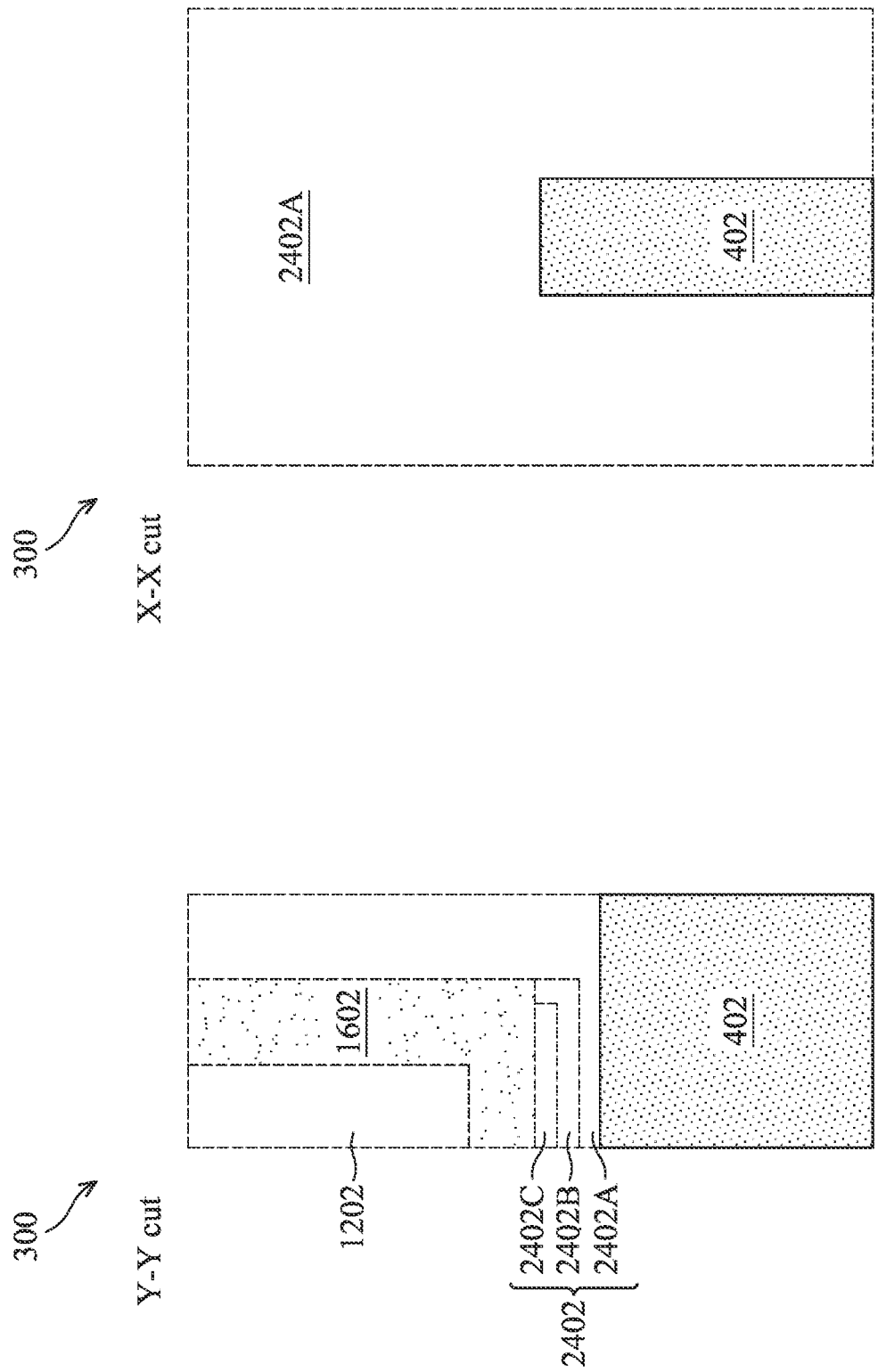

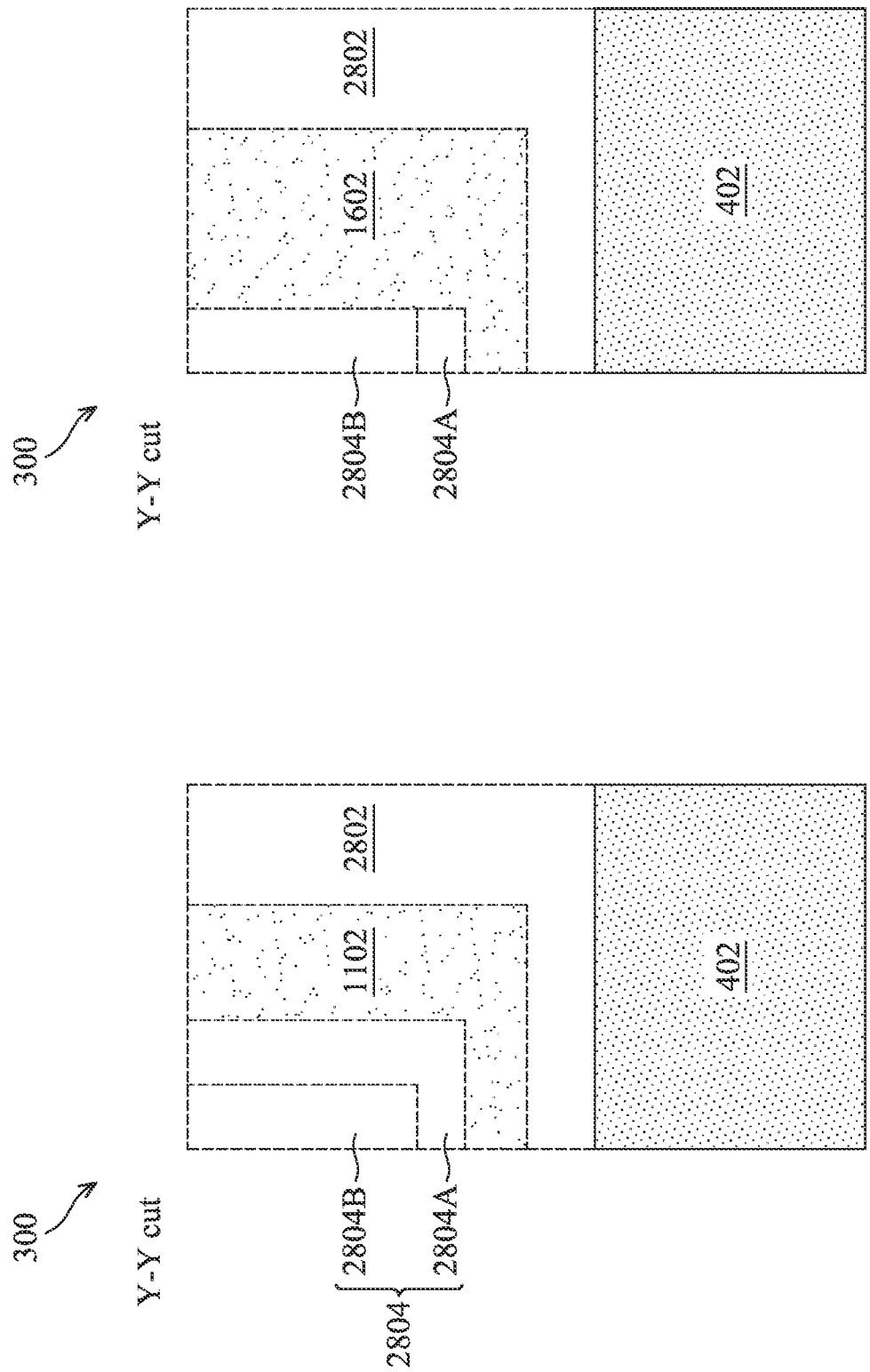

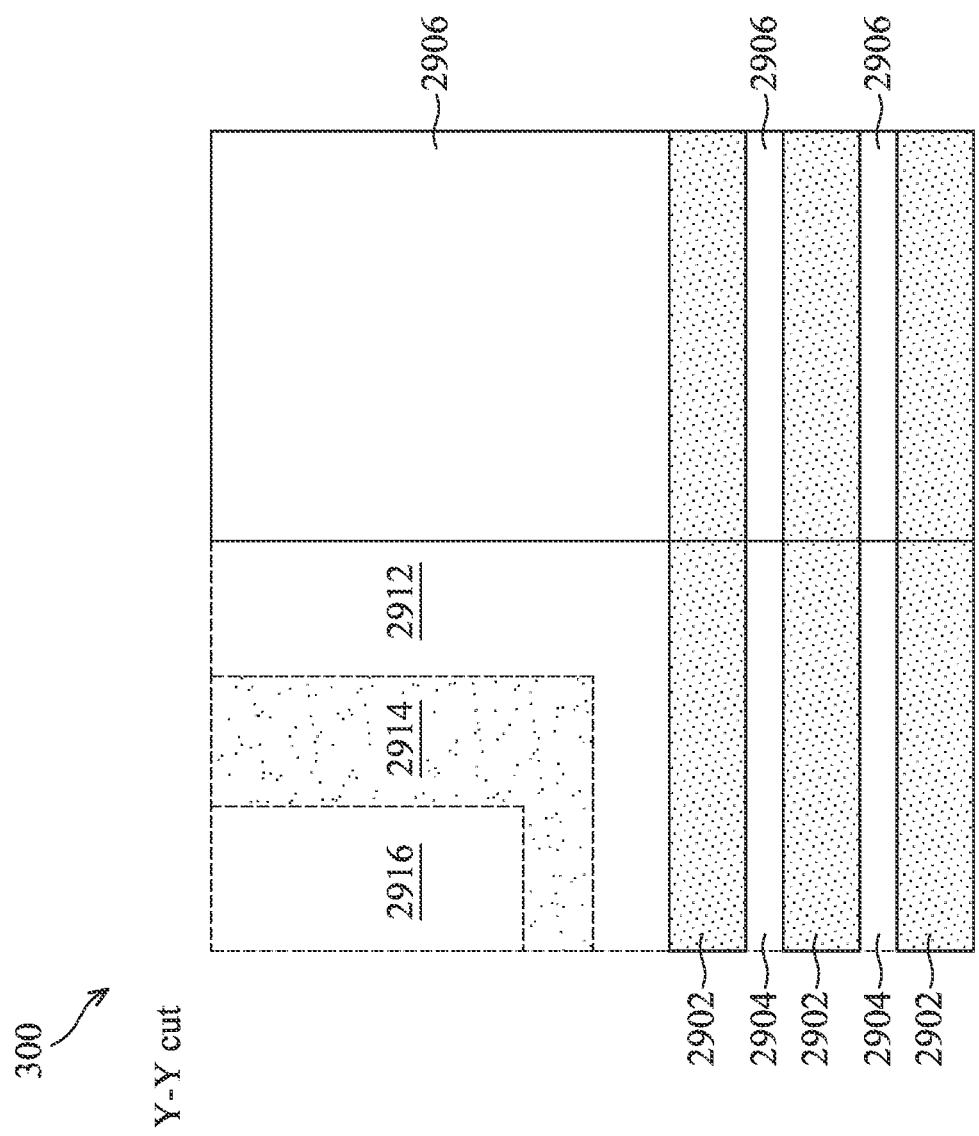

SEMICONDUCTOR DEVICES AND METHODS OF MANUFACTURING THEREOF

CROSS-REFERENCE TO RELATED APPLICATIONS

This application is a continuation of U.S. patent application Ser. No. 18/158,263, filed Jan. 23, 2023, which is a continuation of U.S. patent application Ser. No. 17/230,421, filed Apr. 14, 2021. The entire contents of U.S. patent application Ser. No. 18/158,263 and U.S. patent application Ser. No. 17/230,421 are incorporated herein by reference for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A-B, 18A-B, 19A-B, and 20A-B illustrate cross-sectional views of various embodiments of the example non-planar transistor device, made by the method of FIG. 2, in accordance with some embodiments.

FIGS. 21A-B, 22A-B, 23A-B, 24A-B, and 25A-B illustrate cross-sectional views of various embodiments of the example non-planar transistor device, made by the method of FIG. 2, in accordance with some embodiments.

FIGS. 28A-B illustrate cross-sectional views of the example non-planar transistor device, prior to and subsequently to forming an air gap, respectively, in accordance with some embodiments.

FIG. 29 illustrates a cross-sectional view of various embodiments of the example non-planar transistor device, made by at least some of the operations of the method of FIG. 2, in accordance with some embodiments.

DETAILED DESCRIPTION

Figure 1:
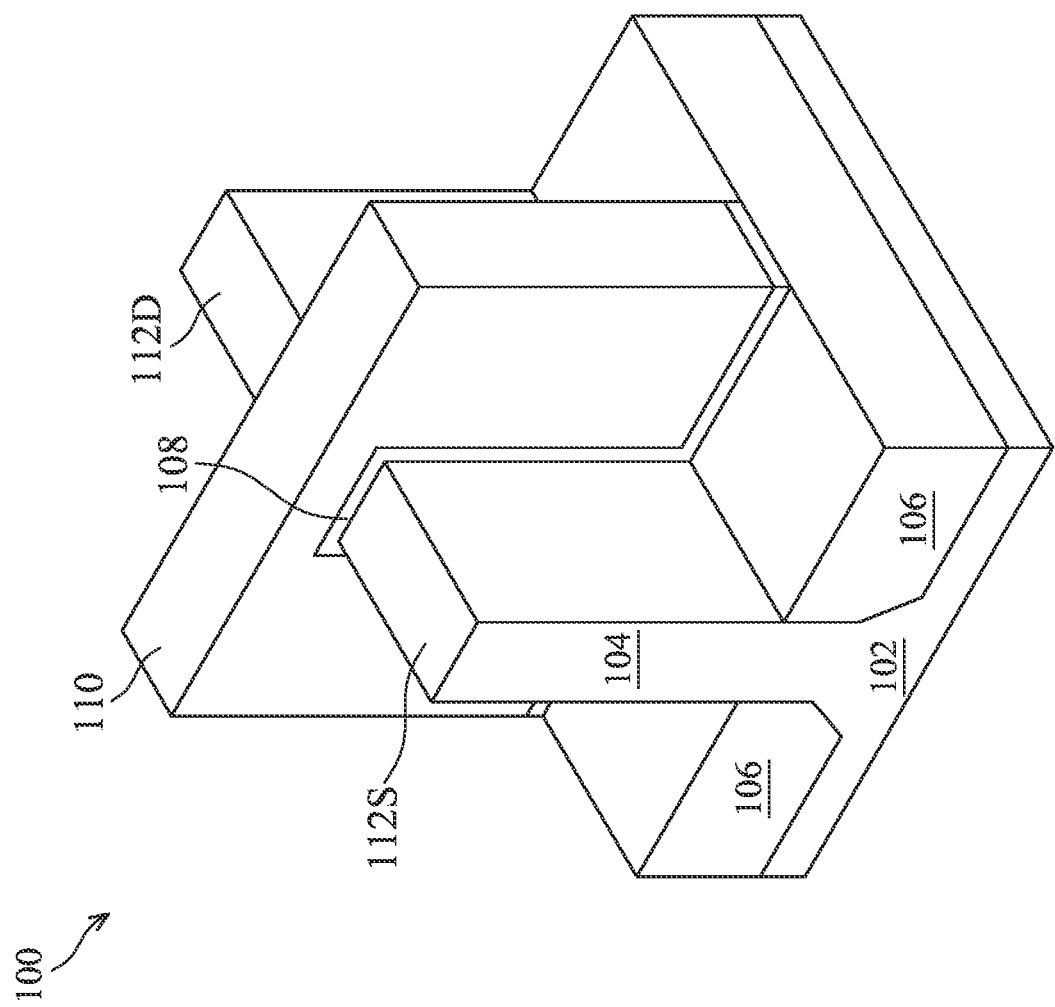
FIG. 1 illustrates a perspective view of an example FinFET device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As integrated circuits continue to decrease in size, limitations in processing capabilities and in fundamental material characteristics have made scaling of planar transistors increasingly difficult (e.g., due to leakage current and process variations). Non-planar transistors such as, for example, fin-based field effect transistors (FinFETs), gate-all-around field effect transistors (GAA FETs), etc., have been proposed as a promising alternative to the planar transistors. In recent years, advances in processing technology have made such non-planar transistors a viable option in emerging technology nodes.

In general, a FinFET includes a three-dimensional fin of semiconducting material that extends between source and drain regions/structures. A gate structure is disposed over the fin of semiconducting material. Often the FinFET further includes gate spacers disposed along sidewalls of the gate structure. The gate spacers are typically made of an electrically insulating material that can define a lateral space between the gate structure and the source/drain structures.

As the size of integrated circuit components continues to shrink, the parasitic capacitance through such gate spacers has become an increasing contributor to the total parasitic capacitance of the FinFET. For example, gate spacers disposed around a gate structure of a FinFET have a dielectric constant that increases parasitic capacitances between the gate structure and the source/drain structure and/or between the gate structure and the contacts corresponding to the source/drain structure. The parasitic capacitance disadvantageously degrades the performance of the FinFET by inducing an RC time delay.

In this regard, the concept to replace a portion of the gate spacer with a material having a lower dielectric constant has been proposed. For example, a middle portion of the gate spacer may be removed, thereby forming an air gap between the gate structure and the source/drain structure, which can advantageously reduce the parasitic capacitance (in turn, reducing the RC time delay). However, in the existing technologies, such a removed portion is disposed between the gate structure and the source/drain structure. Thus, when being removed (e.g., by etchants), the etchants can penetrate through a side portion of the gate space and damage the source/drain structure, which can again disadvantageously degrade the performance of the FinFET.

Embodiments of the present disclosure are discussed in the context of forming non-planar transistor devices (e.g., FinFET devices, gate-all-around (GAA) transistor devices), and in particular, in the context of forming a gate spacer that has an air gap. For example, following the formation of a dummy gate structure over a portion of a partially formed channel structure (e.g., a fin structure, a stack of sacrificial layers and channel layers, etc.), sacrificial gate spacers are formed on opposite sides of the dummy gate structure, and lifted above a top surface of the channel structure with portions of bottom gate spacers. As such, when removing the sacrificial gate spacers with etchants to form air gaps, damages to source/drain structures (by the etchants, if any) can be significantly reduced by the portions of the bottom gate spacers that lift up the sacrificial gate spacers (or the air gaps).

FIG. 1 illustrates a perspective view of an example FinFET device 100, in accordance with various embodiments. The FinFET device 100 includes a substrate 102 and a fin 104 protruding from the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source region 112S and drain region 112D are in (or extended from) the fin 104 and on opposing sides of the gate dielectric 108 and the gate 110. It should be appreciated that FIG. 1 is provided as a simplified reference to illustrate a number of feature of a FinFET device, and thus, the FinFET device 100 can include one or more additional features not shown in FIG. 1. For example, the FinFET device 100 can include a number of pairs of gate spacers disposed on opposite sides of the gate 110, which will be discussed in further detail below.

Figure 2:
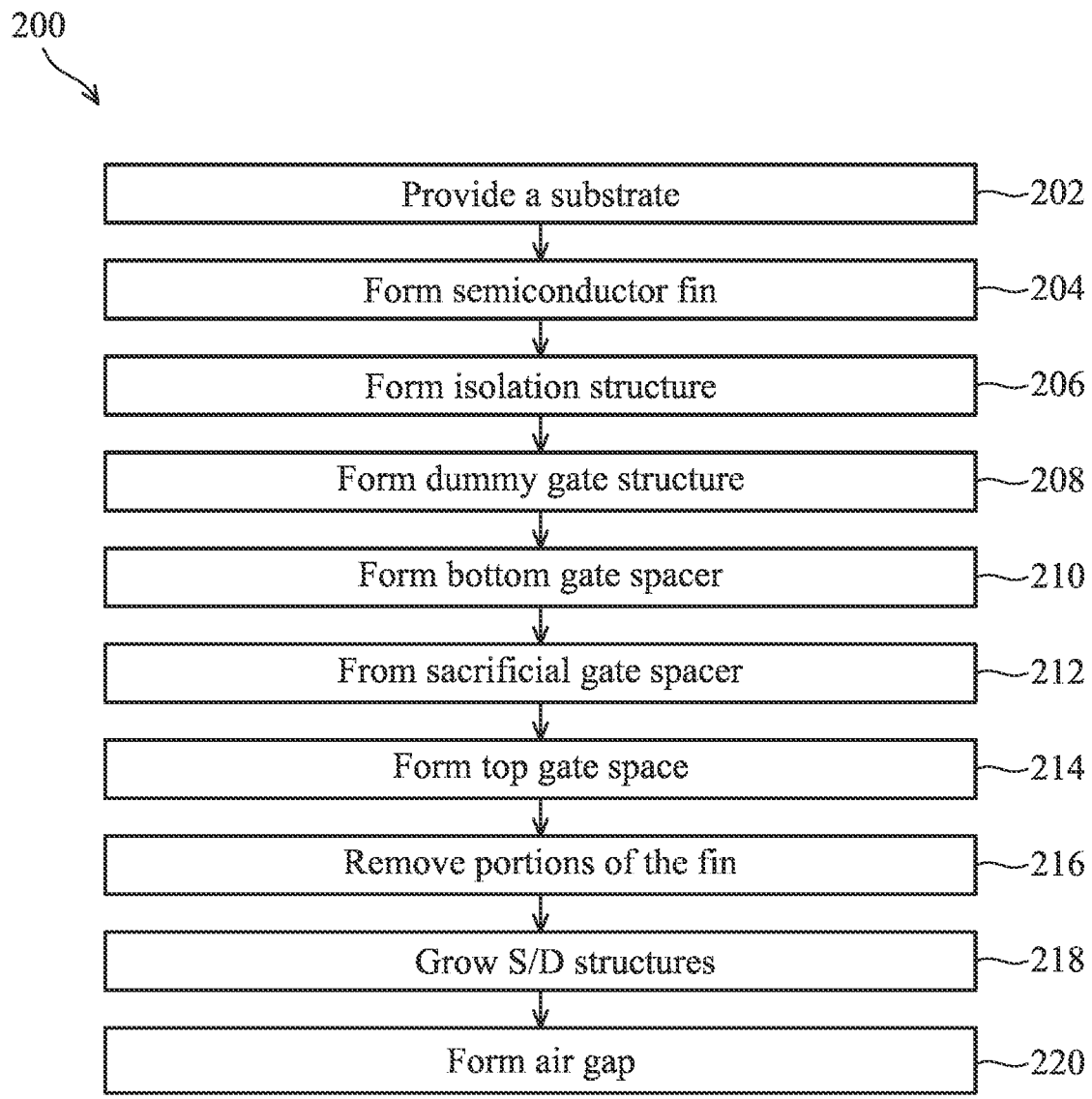
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device 100 (e.g., semiconductor device). However, it should be understood that the method 200 can be used to form a nanosheet transistor device, a nanowire transistor device, a vertical transistor device, a gate-all-around (GAA) transistor device, or the like, while remaining within the scope of the present disclosure. It is noted that the method 200 is merely an example, and is not intended to limit the present disclosure. Accordingly, it is understood that additional operations may be provided before, during, and after the method 200 of FIG. 2, and that some other operations may only be briefly described herein.

In some embodiments, operations of the method 200 may be associated with perspective views of an example non-planar transistor device 300 at various fabrication stages as shown in FIGS. 3, 4, 5, 6, 7, 8, 9, 10, 11, 12, 13, 14, 15, and 16, respectively, which will be discussed in further detail below.

In brief overview, the method 200 starts with operation 202 of providing a substrate. The method 200 continues to operation 204 of forming a semiconductor fin. The method 200 continues to operation 206 of forming an isolation structure. The method 200 continues to operation 208 of forming a dummy gate structure. The method 200 continues to operation 210 of forming a bottom gate spacer. The method 200 continues to operation 212 of forming a sacrificial gate spacer. The method 200 continues to operation 214 of forming a top gate spacer. The method 200 continues to operation 216 of removing portions of the semiconductor fin that are not overlaid by the dummy gate structure. The method 200 continues to operation 218 of growing source/drain structures. The method 200 continues to operation 220 of forming an air gap between the bottom and top gate spacers.

Figure 3:
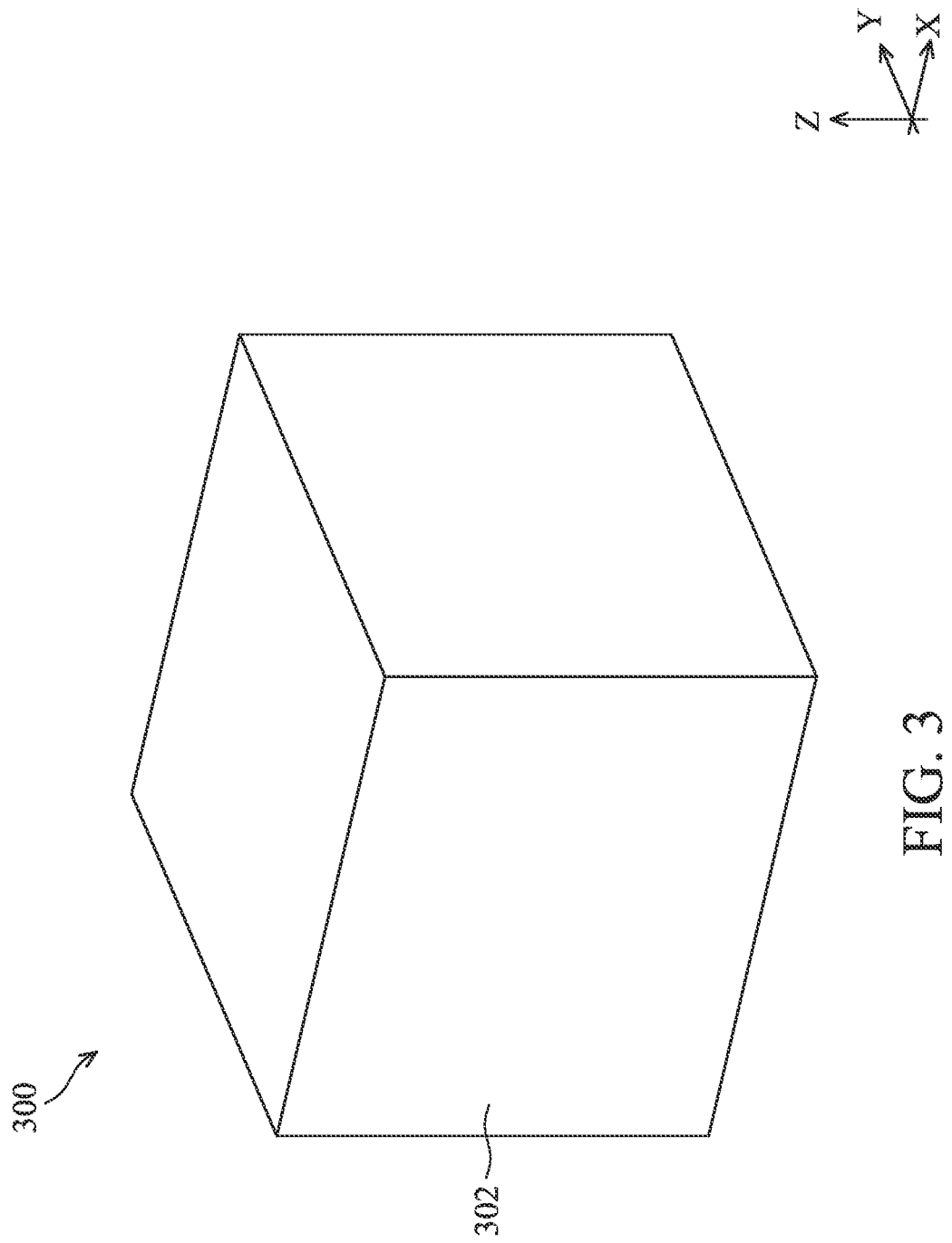
FIGS. 3, 4, 5, 6, 7, 8, 9, 10, 11, 12, 13, 14, 15, and 16 illustrate perspective views of an example non-planar transistor device (or a portion of the example non-planar transistor device) during various fabrication stages, made by the method of FIG. 2, in accordance with some embodiments.

Corresponding to operation 202 of FIG. 2, FIG. 3 is a perspective view of the non-planar transistor device 300 including a semiconductor substrate 302 at one of the various stages of fabrication, in accordance with various embodiments.

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
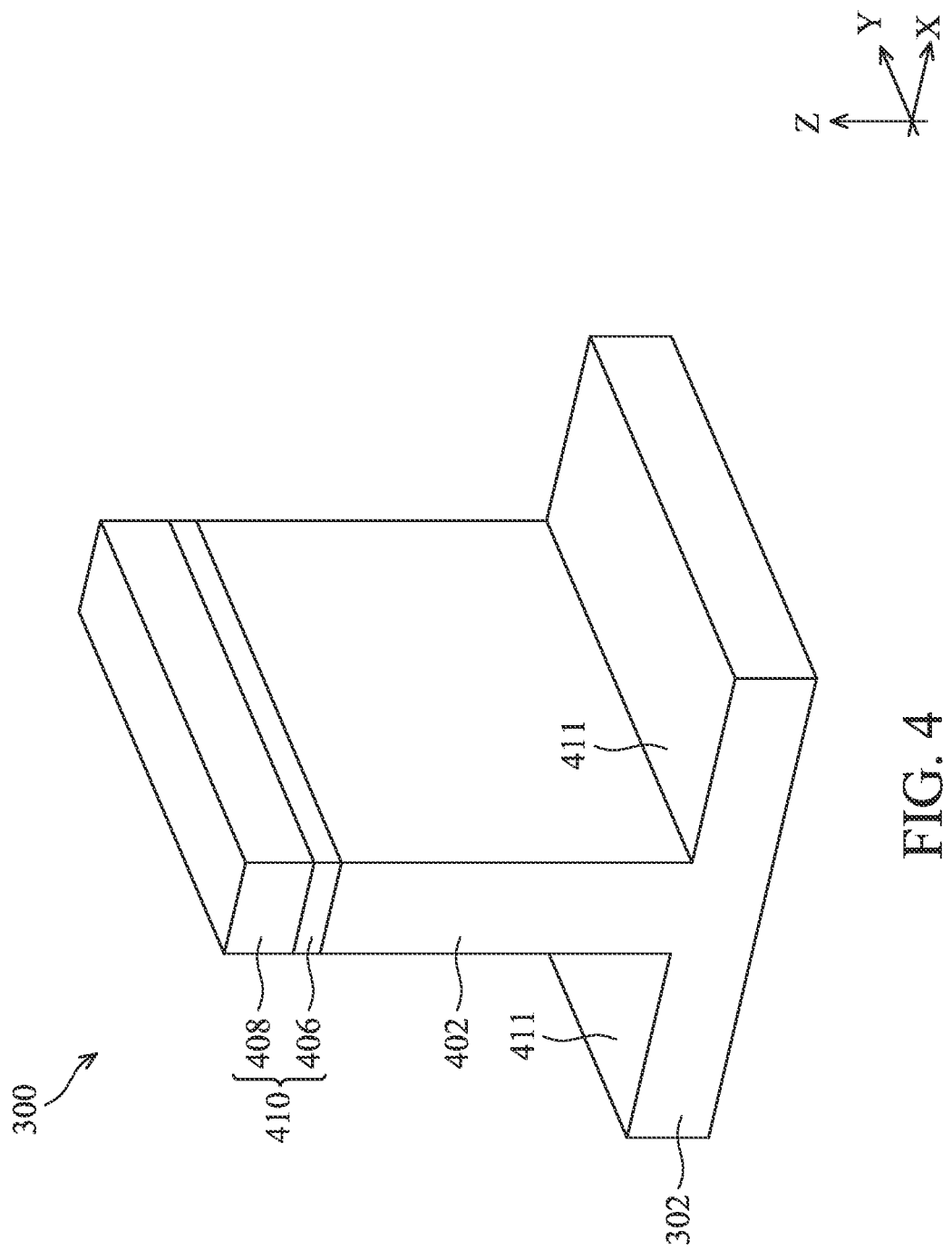

Corresponding to operation 204 of FIG. 2, FIG. 4 is a perspective view of the non-planar transistor device 300 including a semiconductor fin 402 at one of the various stages of fabrication, in accordance with various embodiments. As shown, the semiconductor fin 402 has a lengthwise direction extending along a first lateral direction, e.g., the Y axis.

The semiconductor fin 402 is formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining the semiconductor fin 402 between adjacent trenches 411 as illustrated in FIG. 4. When multiple fins are formed, such a trench may be disposed between any adjacent ones of the fins. In some embodiments, the semiconductor fin 402 is formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fin 402.

The semiconductor fin 402 may be patterned by any suitable method. For example, the semiconductor fin 402 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3-4 illustrate an embodiment of forming the semiconductor fin 402, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fin 402 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more semiconductor fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more semiconductor fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fin 402 may include silicon germanium ($Si_xGe_{1-x}$, where x can be between 0 and 1), silicon carbide, pure silicon, pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
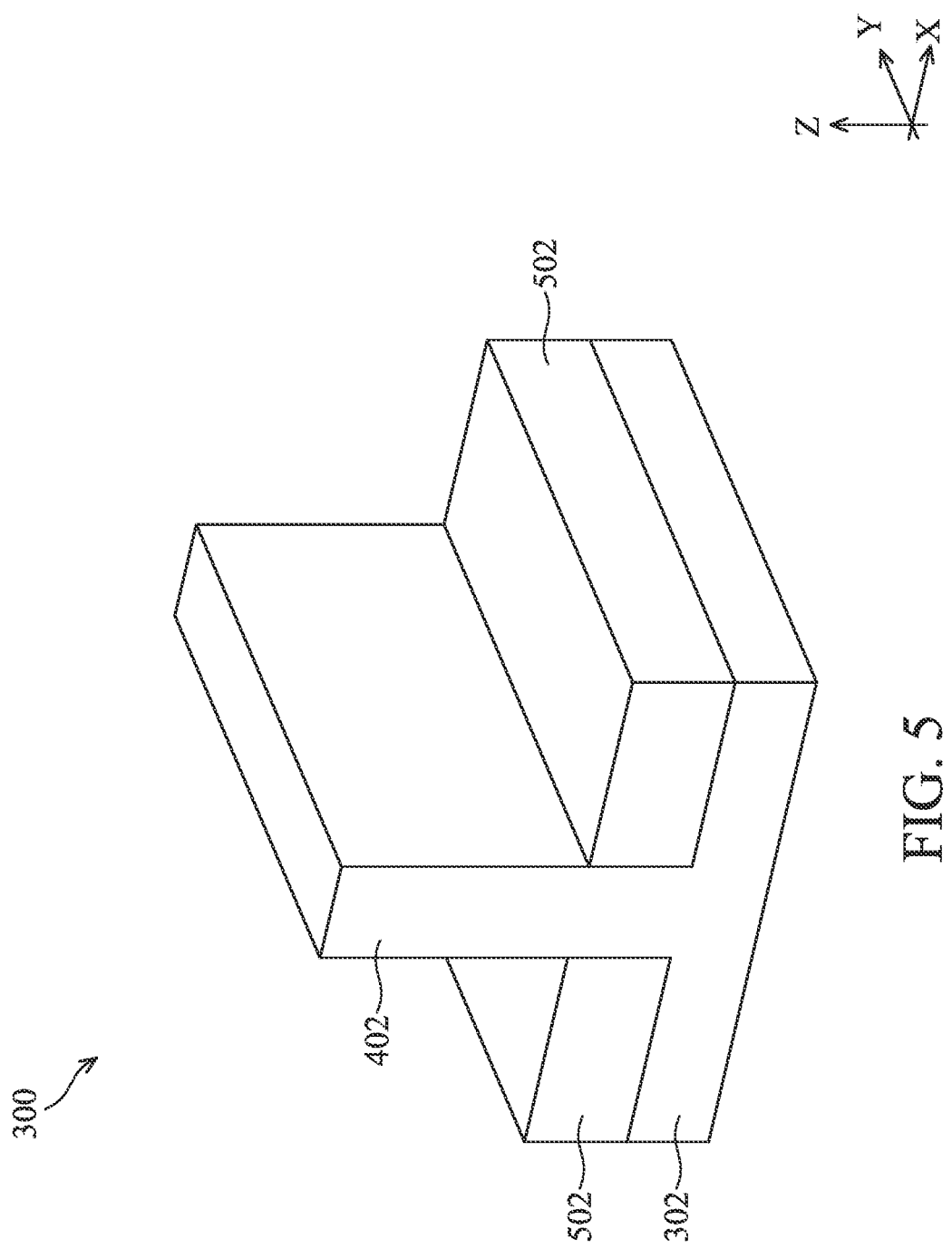

Corresponding to operation 206 of FIG. 2, FIG. 5 is a perspective view of the non-planar transistor device 300 including an isolation region/structure 502 at one of the various stages of fabrication, in accordance with various embodiments.

The isolation structure 502, which is formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material to form top surfaces of the isolation structure 502 and a top surface of the semiconductor fin 402 as a coplanar surface. The patterned mask 410 (FIG. 4) may also be removed by the planarization process.

In some embodiments, the isolation structure 502 includes a liner, e.g., a liner oxide (not shown), at the interface between the isolation structure 502 and the substrate 302 (semiconductor fin 402). In some embodiments, the liner oxide is formed to reduce crystalline defects at the interface between the substrate 302 and the isolation structure 502. Similarly, the liner oxide may also be used to reduce crystalline defects at the interface between the semiconductor fin 402 and the isolation structure 502. The liner oxide (e.g., silicon oxide) may be a thermal oxide formed through a thermal oxidation of a surface layer of the substrate 302, although other suitable method may also be used to form the liner oxide.

Figure 6:
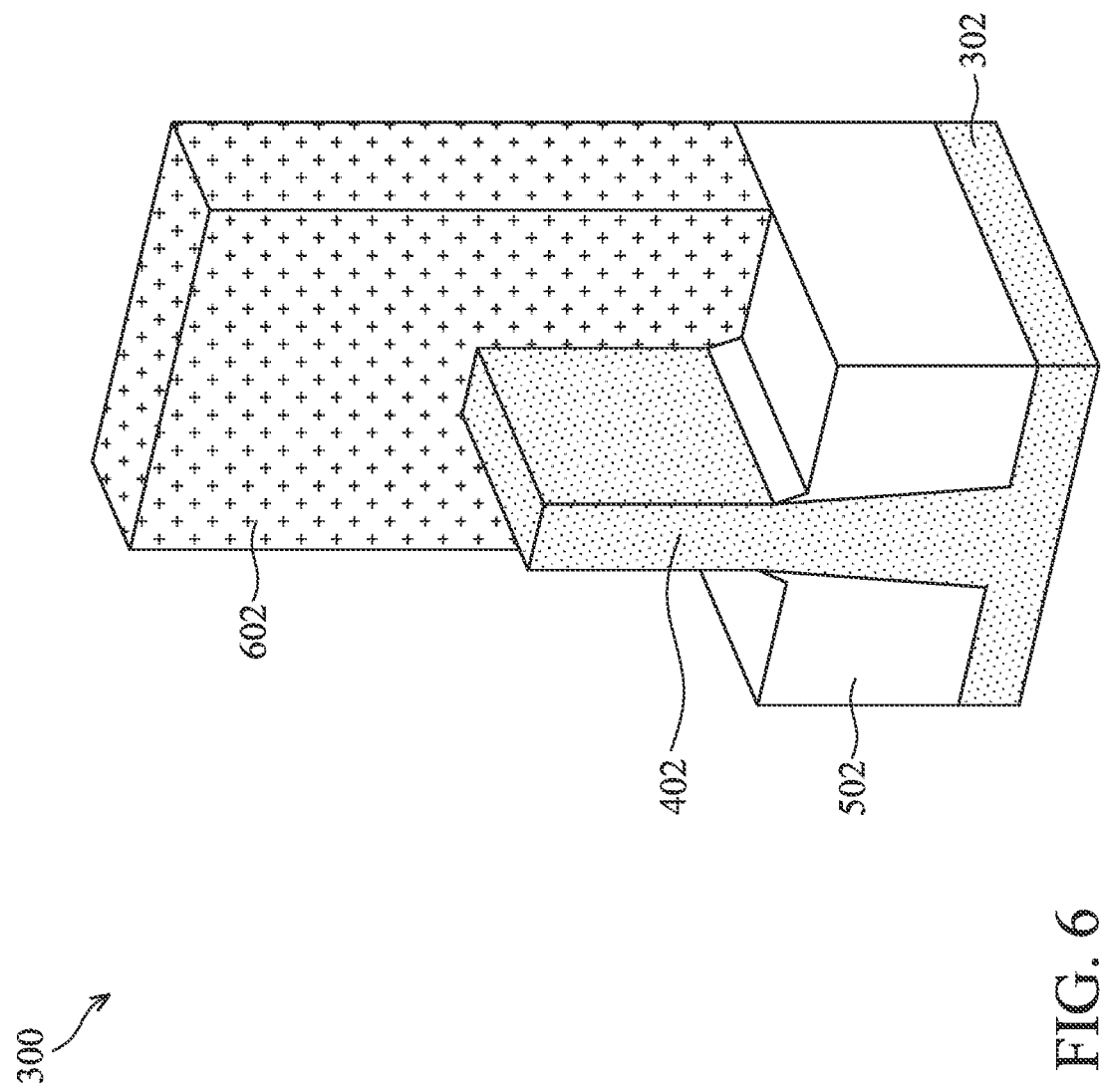

Corresponding to operation 208 of FIG. 2, FIG. 6 is a perspective view of the non-planar transistor device 300 including a dummy gate structure 602 at one of the various stages of fabrication, in accordance with various embodiments. As shown, the dummy gate structure 602 has a lengthwise direction extending along a second lateral direction perpendicular to the lengthwise direction of the semiconductor fin 402, e.g., the X axis. It should be noted that, for purposes of clarity, only a half of the non-planar transistor device 300 (e.g., a half of the semiconductor fin 402 that is disposed on one side of the dummy gate structure 602) is shown in FIG. 6.

The dummy gate structure 602 may include a dummy gate dielectric and a dummy gate electrode, which are not shown separately in the present disclosure. In some embodiments, at least a major portion of the dummy gate structure 602 (e.g., the dummy gate electrode) will be removed in a later removal (e.g., etching) process to form a metal (or otherwise active) gate structure. The dummy gate dielectric and the dummy gate electrode may be formed by performing at least some of the following processes. A dielectric layer (used to form the dummy gate dielectric) is formed over the semiconductor fin 402. The dielectric layer may be, for example, silicon oxide, silicon nitride, multilayers thereof, or the like, and may be deposited or thermally grown.

Next, a gate layer (used to form the dummy gate electrode) is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using acceptable photolithography and etching techniques to form a mask. The pattern of the mask may be transferred to the gate layer and the dielectric layer by an acceptable etching technique to form the dummy gate structure 602.

Figure 7:
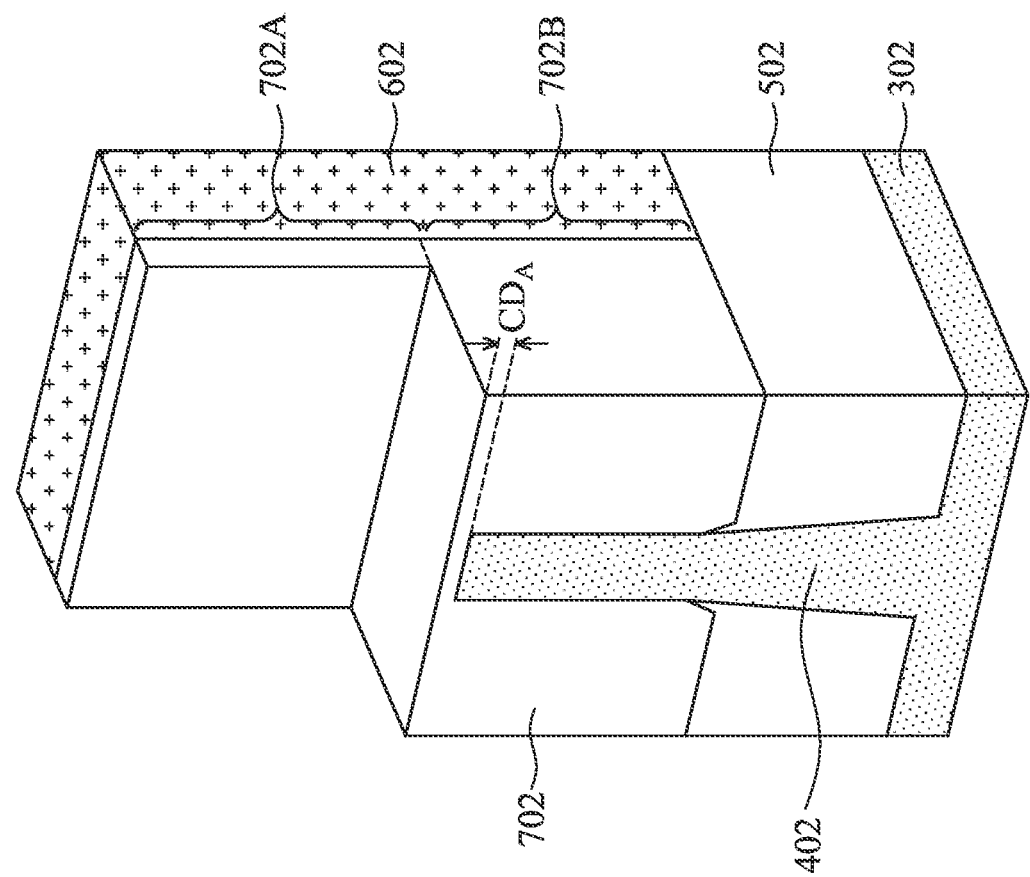

Corresponding to operation 210 of FIG. 2, FIG. 7 is a perspective view of the non-planar transistor device 300 including a first gate spacer (or bottom gate spacer) 702 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 7. Thus, on the other side of the dummy gate structure 602 (along the Y axis), the non-planar transistor device 300 can include another bottom gate spacer 702.

The bottom gate spacer 702 is formed along one of the sidewalls of the dummy gate structure 602 to overlay a portion of the semiconductor fin 402 that is not overlaid by the dummy gate structure 602. In accordance with various embodiments, the bottom gate spacer 702 is formed to have two portions 702A and 702B, as illustrated in FIG. 7. The first (upper) portion 702A extends along an upper portion of the sidewall of the dummy gate structure 602, and the second (lower) portion 702B extends along a lower portion of the sidewall of the dummy gate structure 602. Further, the second portion 702B laterally extends farther (along the Y axis) than the first portion 702A, which forms an L-shaped profile. As such, the second portion 702B can contact or otherwise overlay a top surface and sidewalls of the portion of the semiconductor fin 402 that is not overlaid by the dummy gate structure 602.

By overlaying the top surface of the semiconductor fin 402 with the second portion 702B, a sacrificial gate spacer, which will be later removed to form an air gap between the bottom and top gate spacers, can be lifted away (e.g., up) from the semiconductor fin 402, which will be later replaced with a source/drain structure. Such a lifting portion of the bottom gate spacer 702 (second portion 702B) can protect the source/drain structure, when removing the sacrificial gate spacer, which will be discussed in further detail below. In some embodiments, this lifting portion of the bottom gate spacer 702 may be characterized with a critical dimension, $CD_A$. As a non-limiting example, $CD_A$ can range between about 0.3 nanometers (nm) and about 20 nm. With such a non-zero $CD_A$, the source/drain structure can be protected when removing the sacrificial gate spacer.

To form the bottom gate spacer 702, an insulation material may be first deposited over the workpiece, followed by an etching process to trim the insulation material to include the first and second portions of the bottom gate spacer, 702A and 702B. The insulation material may include a silicon-based dielectric material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), silicoboron carbonitride (SiBCN), silicoboron oxycarbonitride (SiBOCN), or combinations thereof. In some other embodiments, the insulation material may include a metal-based dielectric material such as, for example, hafnium oxide (HfO), aluminium oxide (AlO), copper oxide (CuO), titanium nitride (TiN), or combinations thereof.

The insulation material may be deposited by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof. Other insulation materials and/or other formation processes may be used, while remaining within the scope of the present disclosure.

Following the deposition of the insulation material, an anisotropic etching process can be used to trim or otherwise pattern the insulation material. For example, an etching rate of the etching process may be dynamically or semi-dynamically changed (e.g., by changing the source power and/or bias power) to thin down the first portion 702A (by removing its sidewall portion) and recessing the second portion 702B (by removing its top portion) until the desired $CD_A$ of the lifting portion has been reached.

In various embodiments, the etching process can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1, 3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof to control the above-described etching rates.

Figure 8:
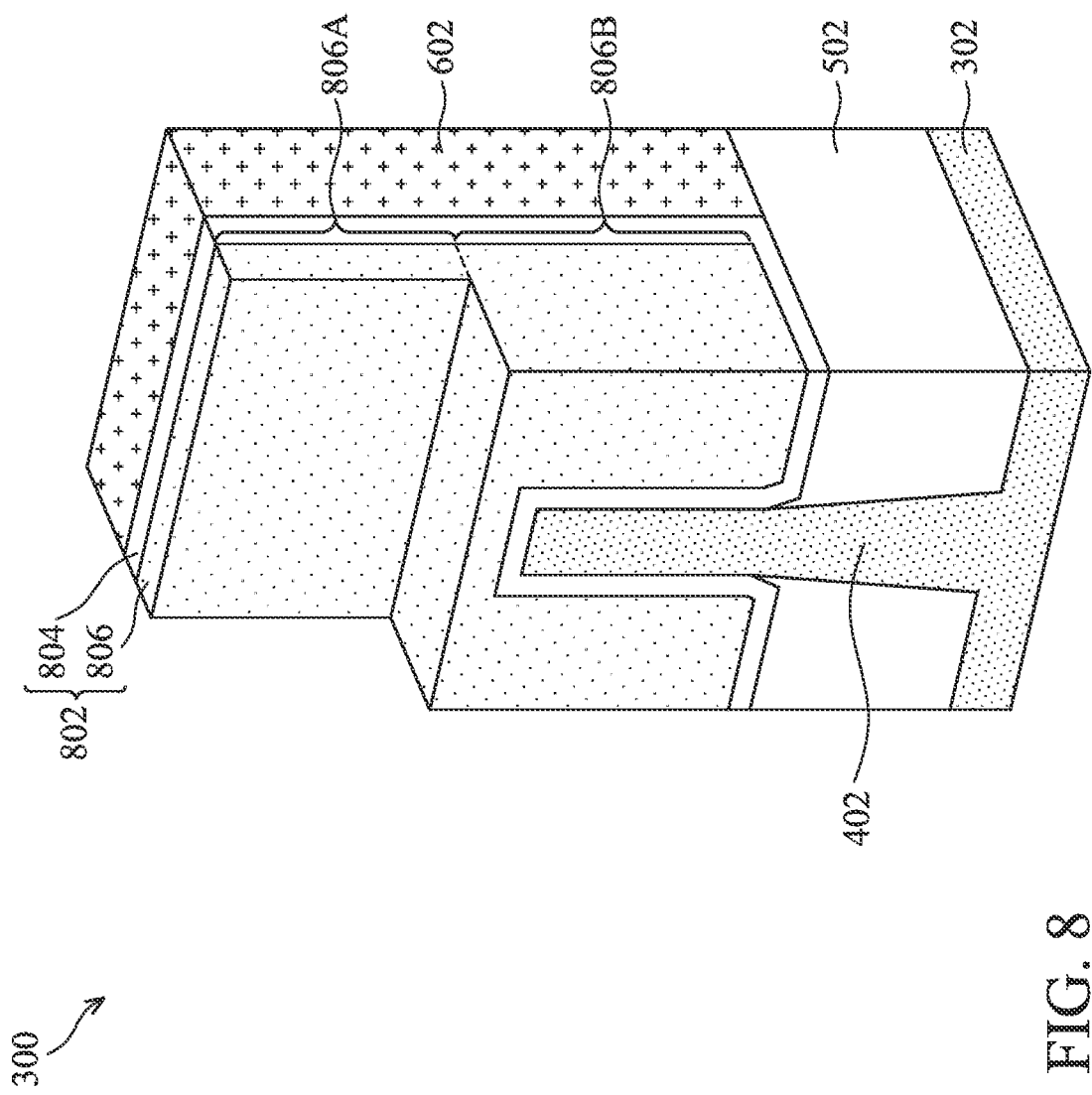
Figure 9:
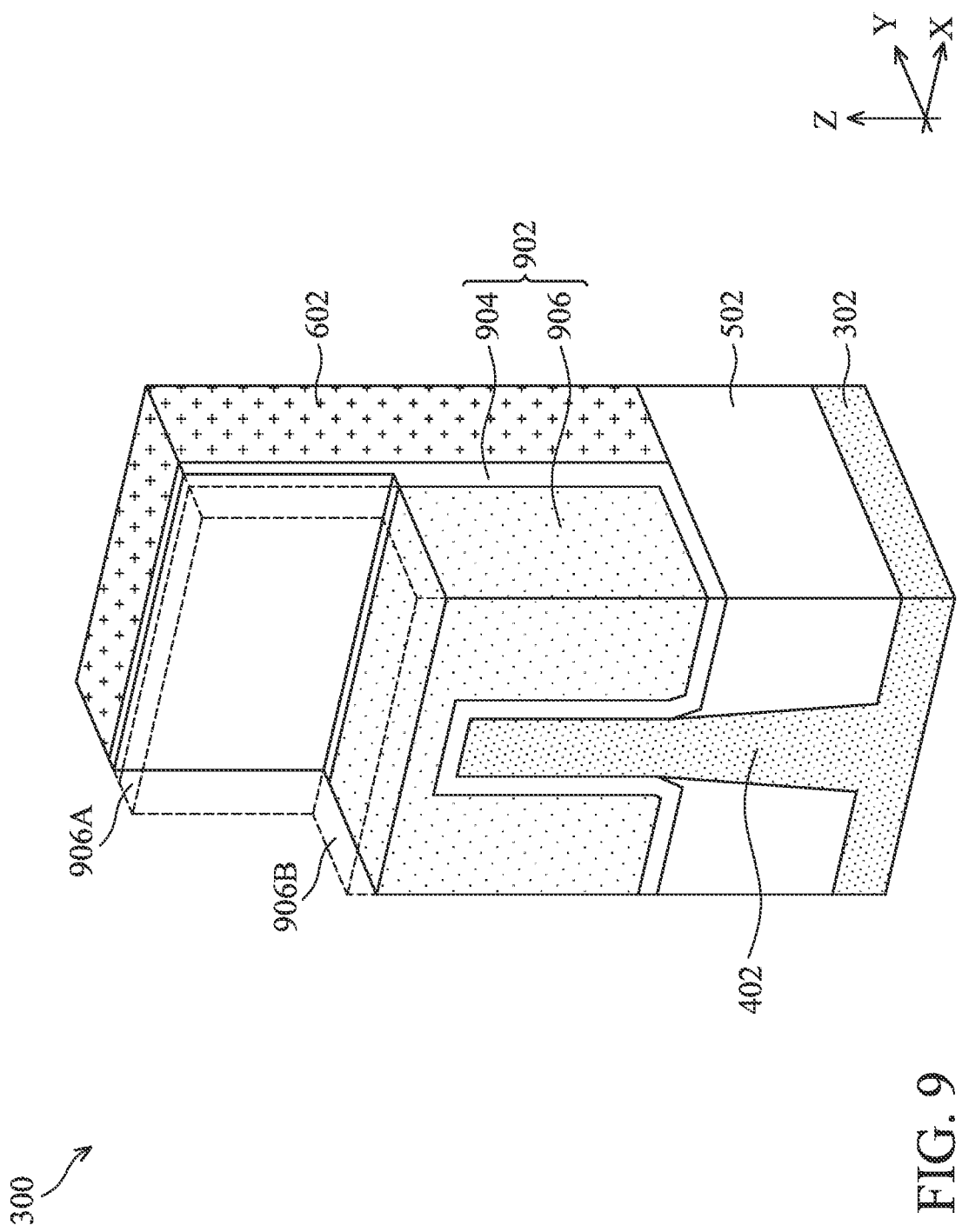
Figure 10:
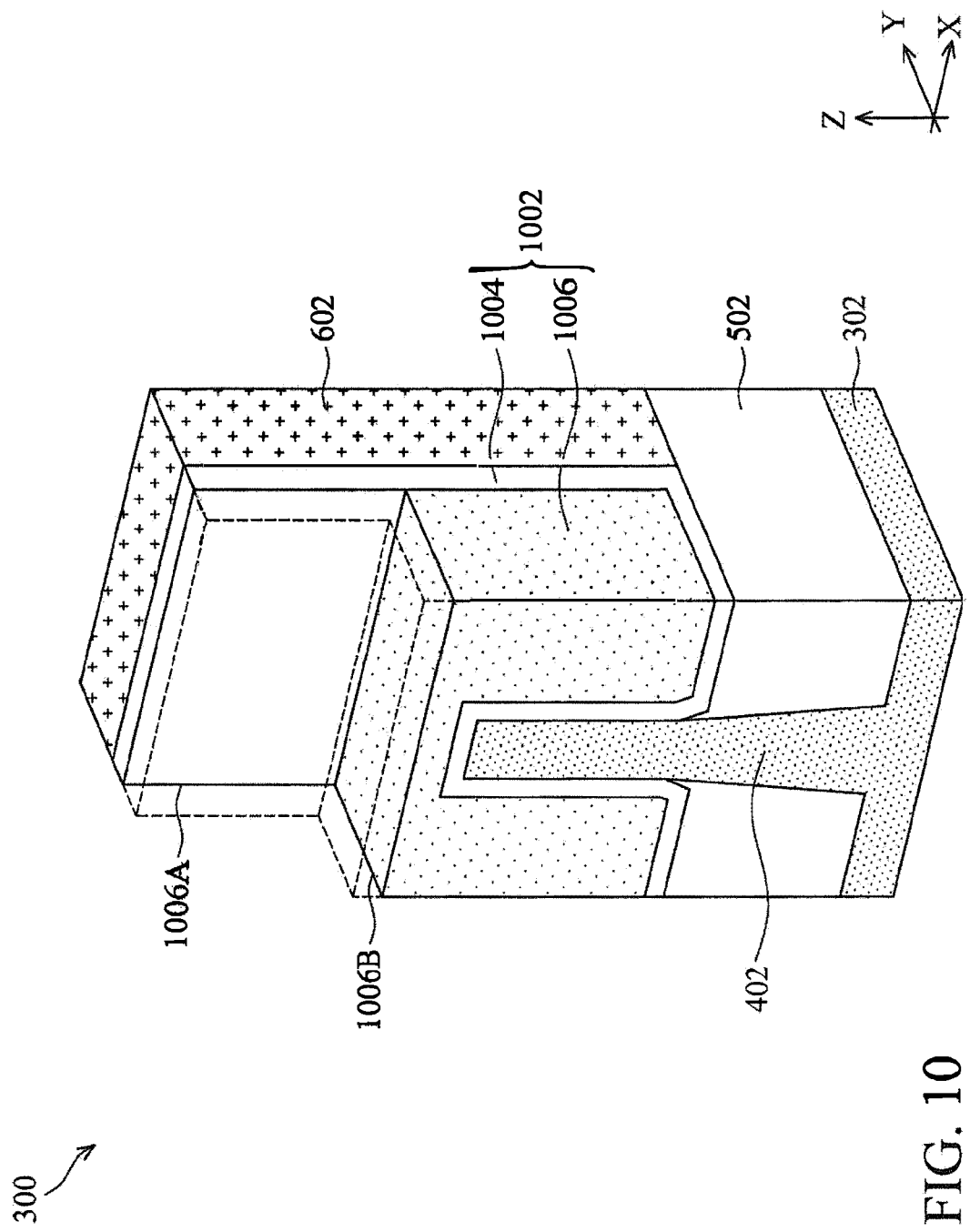

Also corresponding to operation 210 of FIG. 2, FIGS. 8, 9, and 10 each provide a perspective view of the non-planar transistor device 300 including a bottom gate spacer 802/902/1002 that includes a number of layers stacked on top of one another, in accordance with various other embodiments. Although the illustrated examples of FIGS. 8-10 show that the bottom gate spacers each include two layers, it should be appreciated that the bottom gate spacer can include any number of layers (e.g., up to 20 layers), while remaining within the scope of the present disclosure.

Referring first to FIG. 8, the bottom gate spacer 802 includes layers 804 and 806. Each of the layers 804 and 806 includes an insulation material similar as the material of the bottom gate spacer 702, as discussed above with respect to FIG. 7. In some embodiments, the layer 804 may be (e.g., conformally) formed as a relative thin layer to overlay (e.g., contact) a top surface and sidewalls of the portion of the semiconductor fin 402 that is not overlaid by the dummy gate structure 602. Different from the embodiment illustrated in FIG. 7, the layer 804 (given its relatively thin thickness) may follow a profile defined by the semiconductor fin 402, the STI 502, and the dummy gate structure 602. Following the formation of the layer 804, the layer 806 is deposited over the layer 804, with a relatively thick thickness. As such, the layer 806 can be formed to include a first portion 806A and a second portion 806B that extend along an upper portion and a lower portion of the sidewall of the dummy gate structure 602, respectively. Further, the second portion 806B laterally extends (along the Y axis) farther than the first portion 806A, which forms an L-shaped profile.

Referring next to FIG. 9, the bottom gate spacer 902 includes layers 904 and 906. Each of the layers 904 and 906 includes an insulation material similar as the material of the bottom gate spacer 702, as discussed above with respect to FIG. 7. In some embodiments, the layer 904 may be (e.g., conformally) formed as a relative thin layer to overlay (e.g., contact) a top surface and sidewalls of the portion of the semiconductor fin 402 that is not overlaid by the dummy gate structure 602. Different from the embodiment illustrated in FIG. 7, the layer 904 (given its relatively thin thickness) may follow a profile defined by the semiconductor fin 402, the STI 502, and the dummy gate structure 602.

Following the formation of the layer 904, the layer 906 is deposited over the layer 904, with a relatively thick thickness. As such, the layer 906 can be formed to include a first portion 906A and a second portion 906B that extend along an upper portion and a lower portion of the sidewall of the dummy gate structure 602, respectively. Further, the second portion 906B laterally extends (along the Y axis) farther than the first portion 906A, which forms an L-shaped profile. Next, an etching process may be performed to remove the first portion 906A, thin down an upper sidewall portion of the layer 904, and recess a top portion of the second portion 906B, all of which are shown in dotted lines. As such, the layer 904 can present an L-shaped profile. The L-shaped profile may be constituted by an intermediate surface and an upper sidewall of the layer 904, in which the intermediate surface is coplanar with a top surface of the remaining second portion 906B.

Referring then to FIG. 10, the bottom gate spacer 1002 includes layers 1004 and 1006. Each of the layers 1004 and 1006 includes an insulation material similar as the material of the bottom gate spacer 702, as discussed above with respect to FIG. 7. In some embodiments, the layer 1004 may be (e.g., conformally) formed as a relative thin layer to overlay (e.g., contact) a top surface and sidewalls of the portion of the semiconductor fin 402 that is not overlaid by the dummy gate structure 602. Different from the embodiment illustrated in FIG. 7, the layer 1004 (given its relatively thin thickness) may follow a profile defined by the semiconductor fin 402, the STI 502, and the dummy gate structure 602.

Following the formation of the layer 1004, the layer 1006 is deposited over the layer 1004, with a relatively thick thickness. As such, the layer 1006 can be formed to include a first portion 1006A and a second portion 1006B that extend along an upper portion and a lower portion of the sidewall of the dummy gate structure 602, respectively. Further, the second portion 1006B laterally extends (along the Y axis) farther than the first portion 1006A, which forms an L-shaped profile. Next, an etching process may be performed to remove the first portion 1006A and recess a top portion of the second portion 1006B, all of which are shown in dotted lines. As such, the layers 1004 and 1006 can collectively present an L-shaped profile. The L-shaped profile may be constituted by a top surface of the remaining second portion 1006B and an upper sidewall of the layer 1004.

Figure 11:
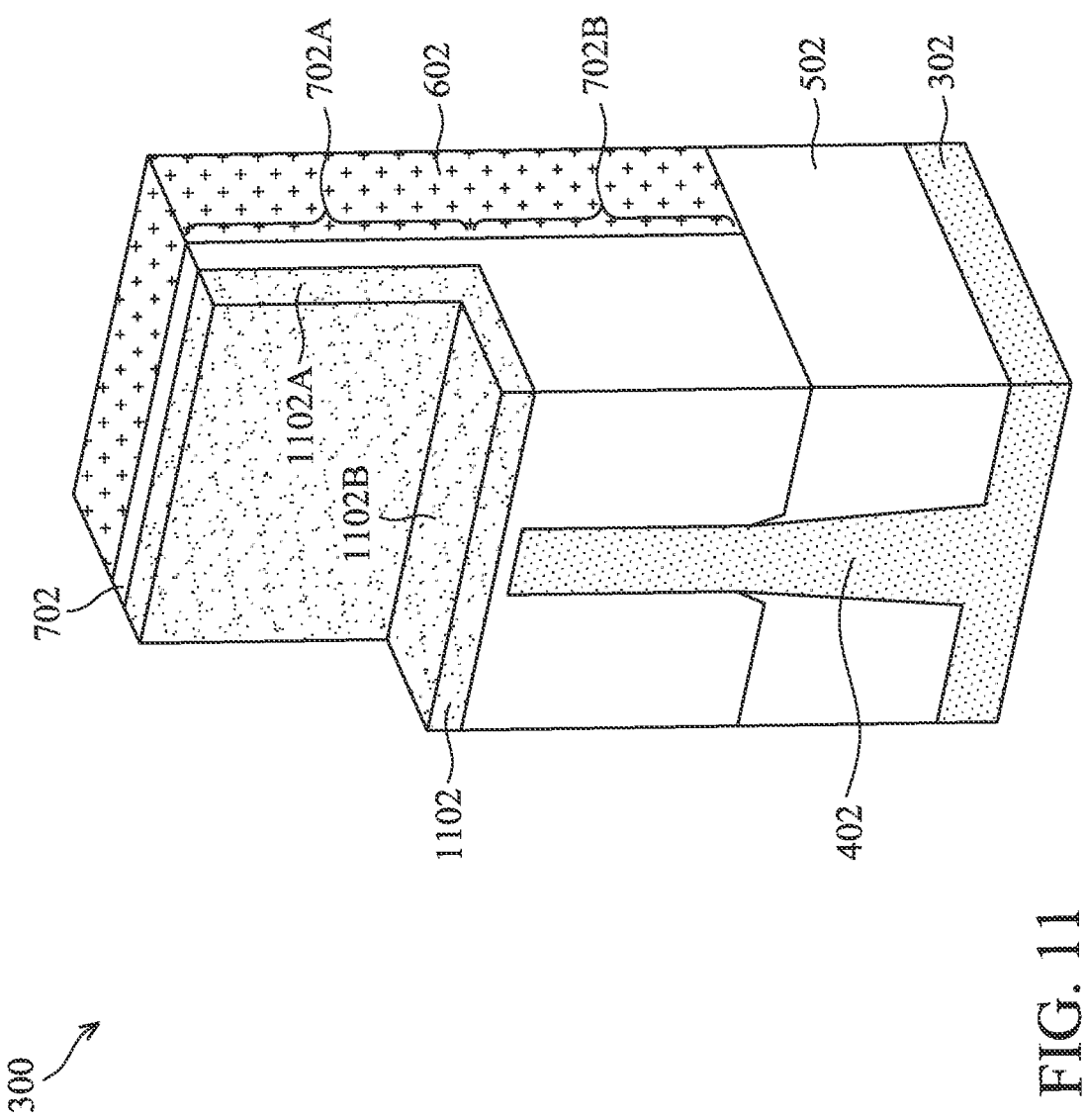

Corresponding to operation 212 of FIG. 2, FIG. 11 is a perspective view of the non-planar transistor device 300 including a second gate spacer (or sacrificial gate spacer) 1102 at one of the various stages of fabrication, in accordance with various embodiments. As a representative example, the sacrificial gate spacer 1102 is formed over the bottom gate spacer 702 (FIG. 7). It should be noted that, for purposes of clarity, only a half of the non-planar transistor device 300 (e.g., a half of the semiconductor fin 402 that is disposed on one side of the dummy gate structure 602) is shown in FIG. 11. Thus, on the other side of the dummy gate structure 602 (along the Y axis), the non-planar transistor device 300 can include another sacrificial gate spacer 1102.

In some embodiments, the sacrificial gate spacer 1102 may be (e.g., conformally) formed as a relatively thin layer, which allows the sacrificial gate spacer 1102 to follow the L-shaped profile of the bottom gate spacer 702. For example in FIG. 11, the sacrificial gate spacer 1102 can have a vertically extending portion 1102A and a laterally extending portion 1102B to collectively form an L-shaped profile. The sacrificial gate spacer 1102 can be later removed to form an air gap between the bottom gate spacer 702 and a top gate spacer (which will be discussed below). By lifting the sacrificial gate spacer 1102 away from the semiconductor fin 402 with the bottom gate spacer 702, etchants used to remove the sacrificial gate spacer 1102 can be blocked from reaching (e.g., damaging) a source/drain structure through the lifting portion of the bottom gate spacer 702 between the semiconductor fin 402 and the sacrificial gate spacer 1102.

To form the sacrificial gate spacer 1102, an insulation material may be deposited over the workpiece. The insulation material may include a silicon-based dielectric material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), silicoboron carbonitride (SiBCN), silicoboron oxycarbonitride (SiBOCN), or combinations thereof. In some other embodiments, the insulation material may include a metal-based dielectric material such as, for example, hafnium oxide (HfO), aluminium oxide ($Al_2O_3$), copper oxide (CuO), titanium nitride (TiN), or combinations thereof.

The insulation material may be deposited by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof. Other insulation materials and/or other formation processes may be used, while remaining within the scope of the present disclosure.

Figure 12:
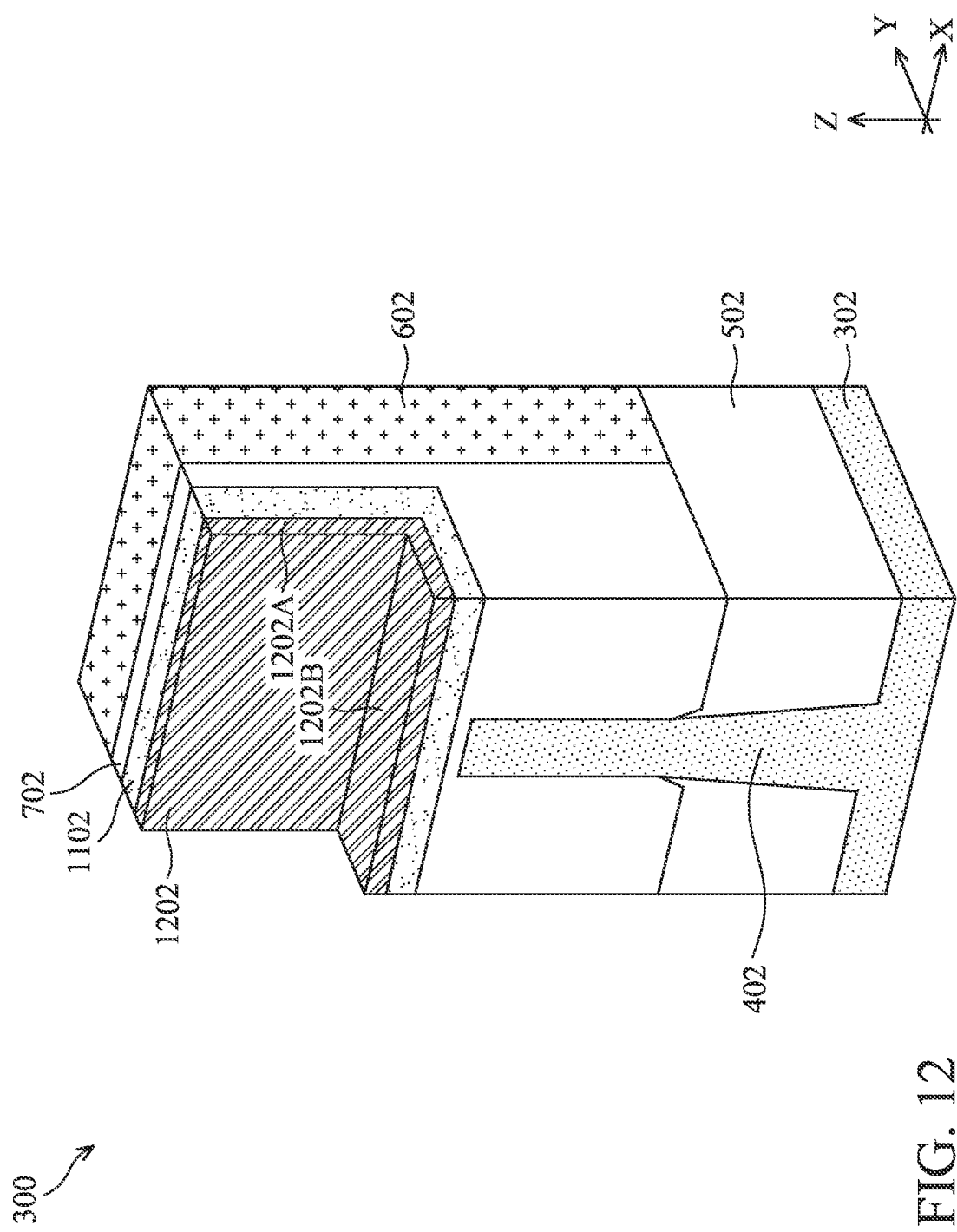

Corresponding to operation 214 of FIG. 2, FIG. 12 is a perspective view of the non-planar transistor device 300 including a third gate spacer (or top gate spacer) 1202 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 12. Thus, on the other side of the dummy gate structure 602 (along the Y axis), the non-planar transistor device 300 can include another top gate spacer 1202.

In some embodiments, the top gate spacer 1202 may be (e.g., conformally) formed as a relatively thin layer, which allows the top gate spacer 1202 to follow the L-shaped profile of the sacrificial gate spacer 1102. For example in FIG. 12, the top gate spacer 1202 can have a vertically extending portion 1202A and a laterally extending portion 1202B to collectively form an L-shaped profile.

To form the top gate spacer 1202, an insulation material may be deposited over the workpiece. The insulation material may include a silicon-based dielectric material such as, for example, silicon oxide (SiO), silicon nitride (SiN), silicon carbide (SiC), silicon carbide nitride (SiCN), silicon oxycarbonitride (SiOCN), silicon oxynitride (SiON), silicon oxycarbide (SiOC), silicoboron carbonitride (SiBCN), silicoboron oxycarbonitride (SiBOCN), or combinations thereof. In some other embodiments, the insulation material may include a metal-based dielectric material such as, for example, hafnium oxide (HfO), aluminium oxide ($Al_2O_3$), copper oxide (CuO), titanium nitride (TiN), or combinations thereof.

According to various embodiments of the present disclosure, the material of the sacrificial gate spacer 1102 is different from the material of the bottom and top gate spacers, 702 and 1202, thereby presenting a high etching selectivity that etches the sacrificial gate spacer 1102 at a substantially higher rate (e.g., greater than 5×) than the bottom and top gate spacers, 702 and 1202. Alternatively, the bottom, sacrificial, and top gate spacers, 702, 1102, and 1202, may be formed of a similar material, but with different compositions. For example, the bottom, sacrificial, and top gate spacers may be formed of SiCN, but the bottom and top gate spacers include a higher concentration of carbon, compared to a lower carbon concentration contained in the sacrificial gate spacer. As such, when removing the sacrificial gate spacer to form an air gap, the bottom and top gate spacers may remain substantially intact to sandwich the air gap therebetween.

The insulation material may be deposited by a high density plasma chemical vapor deposition (HDP-CVD), a flowable CVD (FCVD), atomic layer deposition (ALD), epitaxial deposition, plasma-enhanced chemical vapor deposition (PECVD), plasma-enhanced atomic layer deposition (PEALD), or combinations thereof. Other insulation materials and/or other formation processes may be used, while remaining within the scope of the present disclosure.

Figure 13:
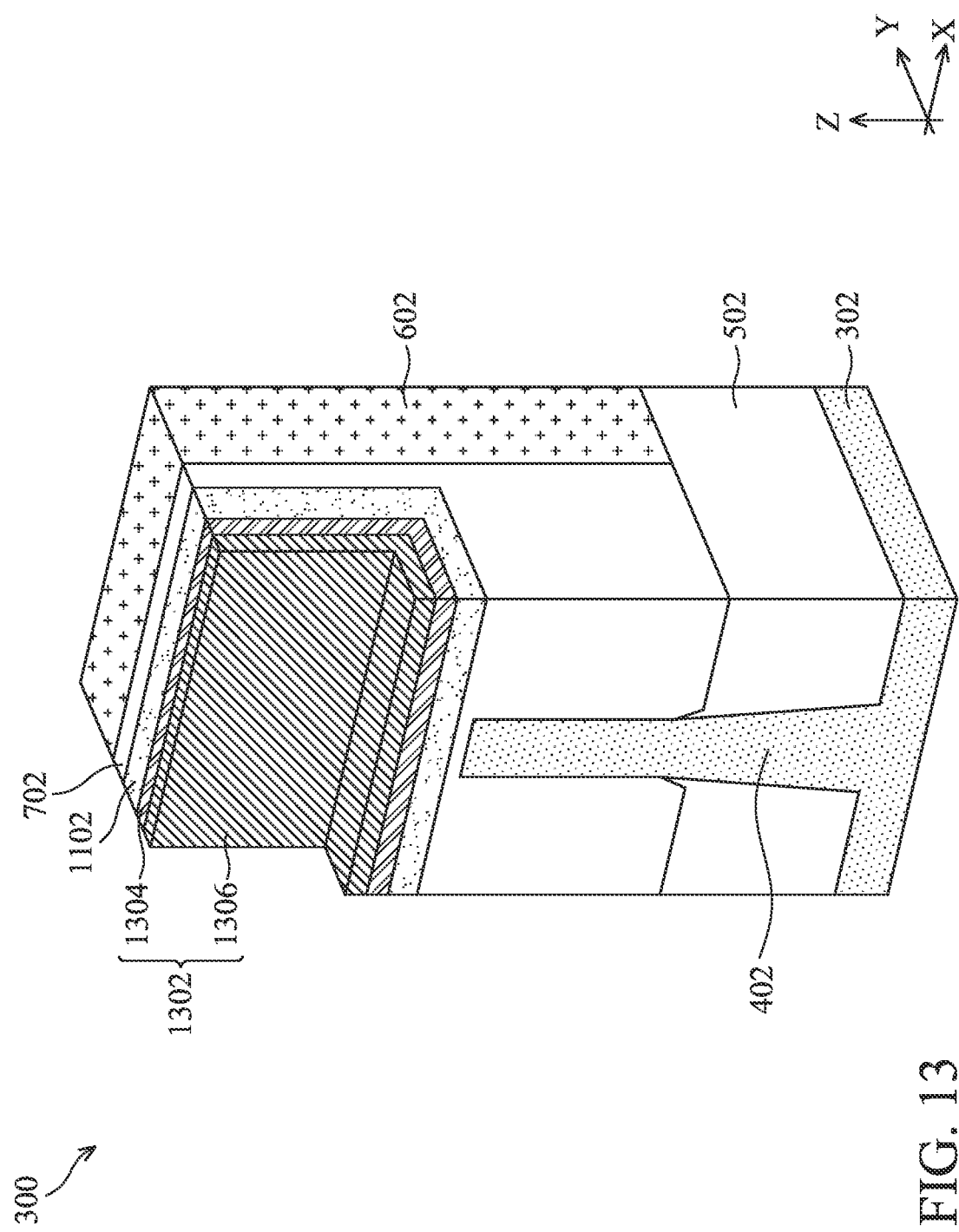

Also corresponding to operation 214 of FIG. 2, FIG. 13 provides a perspective view of the non-planar transistor device 300 including a top gate spacer 1302 that includes a number of layers stacked on top of one another, in accordance with various other embodiments. Although the illustrated examples of FIG. 13 shows that the top gate spacers each include two layers, it should be appreciated that the top gate spacer can include any number of layers (e.g., up to 20 layers), while remaining within the scope of the present disclosure.

The top gate spacer 1302 includes layers 1304 and 1306. In some embodiments, each of the layers 1304 and 1306 of the top gate spacer 1302 may be (e.g., conformally) formed as a relatively thin layer, which allows each of the layers to follow the L-shaped profile of the sacrificial gate spacer 1102. Each of the layers 1304 and 1306 of the top gate spacer 1302 can also present an L-shaped profile, according to some embodiments. Each of the layers of the top gate spacer 1302 may be formed of a material similar as the insulation material of the top gate spacer 1202 (FIG. 12).

Figure 14:
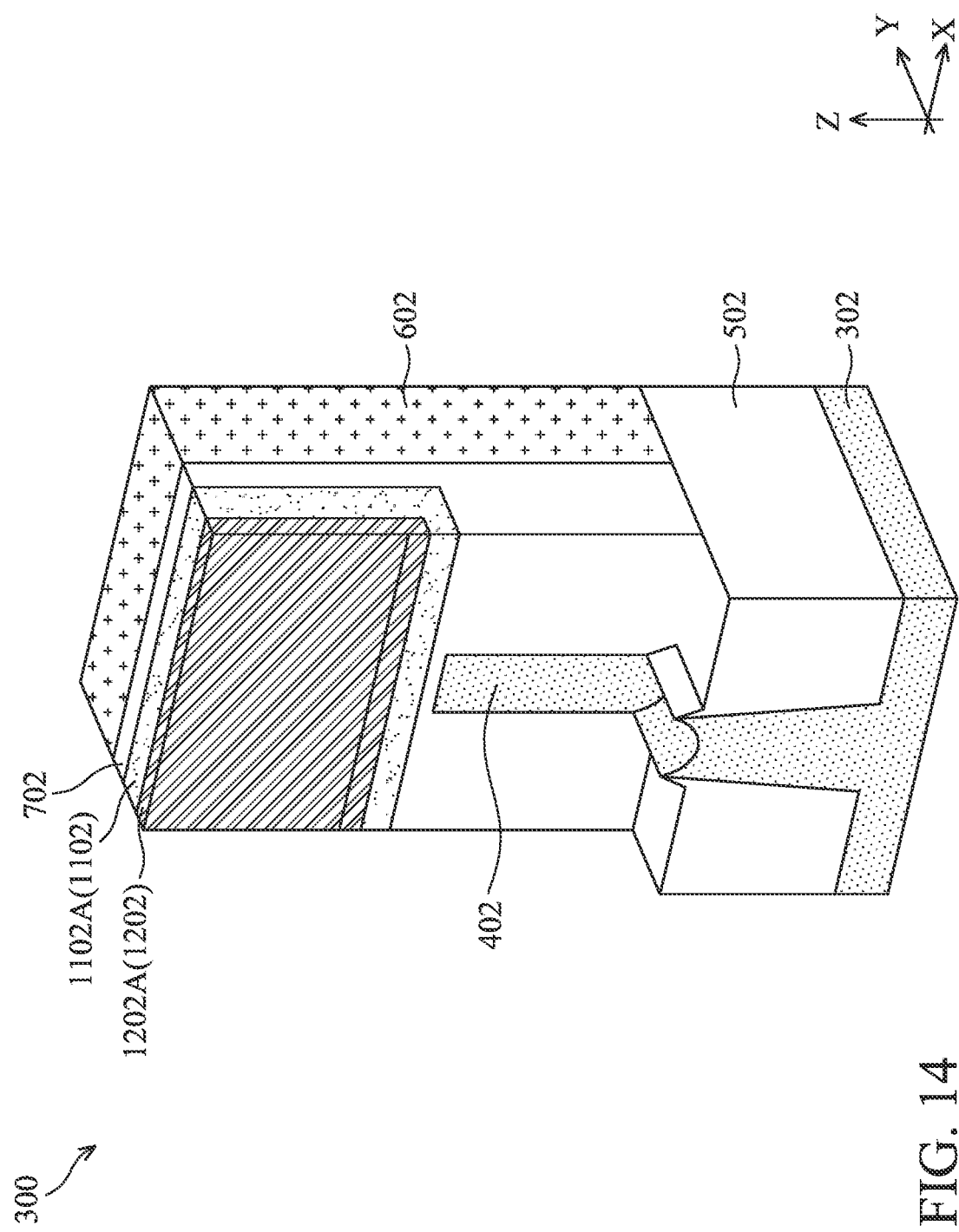

Corresponding to operation 216 of FIG. 2, FIG. 14 is a perspective view of the non-planar transistor device 300 in which a portion of the semiconductor fin 402 that protrudes from the vertically extending portion 1202A of the top gate spacer 1202 is removed at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 14. Thus, another portion of the semiconductor fin 402 on the other side of the dummy gate structure 602 (along the Y axis) is also removed.

In some embodiments, an anisotropic etching process may be performed to remove the protruding portion of the semiconductor fin 402. The etching process may first remove the laterally extending portion 1202B of the top gate spacer 1202 (FIG. 12), the laterally extending portion 1102B of the sacrificial gate spacer 1102 (FIG. 11), portions of the bottom gate spacer 702 that overlays the top surface and sidewalls of the protruding portion of the semiconductor fin 402, and then the protruding portion of the semiconductor fin 402. As such, a sidewall of a portion of the semiconductor fin 402 that is overlaid by the dummy gate structure 602 and gate spacers 702, 1102, and 1202 can be exposed, as shown in FIG. 14.

Figure 15:
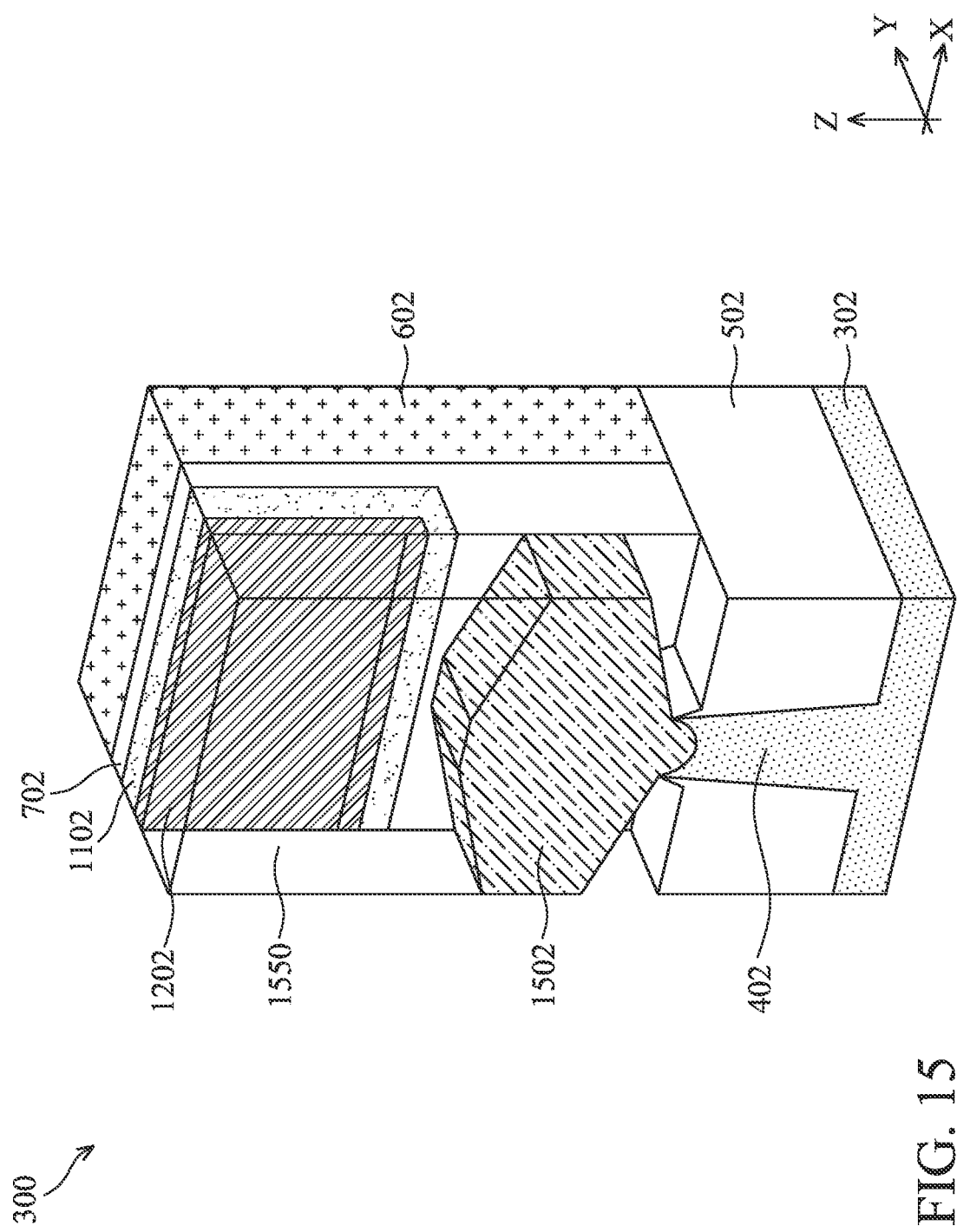

Corresponding to operation 218 of FIG. 2, FIG. 15 is a perspective view of the non-planar transistor device 300 including a source/drain structure 1502 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 15. Thus, on the other side of the dummy gate structure 602 (along the Y axis), the non-planar transistor device 300 can include another source/drain structure 1502.

The source/drain structure 1502 is formed by epitaxially growing a semiconductor material from the exposed sidewalls of the semiconductor fin 402 (FIG. 14). Thus, the source/drain structure 1502 is extended from (e.g., physically connected to) one end of the overlaid portion of the semiconductor fin 402, which functions as the conduction channel of the FinFET 300. Various suitable methods can be used to epitaxially grow the source/drain structure 1502 such as, for example, metal-organic CVD (MOCVD), molecular beam epitaxy (MBE), liquid phase epitaxy (LPE), vapor phase epitaxy (VPE), selective epitaxial growth (SEG), the like, or combinations thereof.

In some embodiments, when the resulting FinFET 300 is an n-type FinFET, the source/drain structure 1502 may include silicon carbide (SiC), silicon phosphorous (SiP), phosphorous-doped silicon carbon (SiCP), or the like. When the resulting FinFET 300 is a p-type FinFET, the source/drain structure 1502 may include SiGe, and a p-type impurity such as boron or indium.

The source/drain structure 1502 may be implanted with dopants to form the source/drain structure 1502, followed by an anneal process. The implanting process may include forming and patterning masks such as a photoresist to cover the regions of the FinFET 300 that are to be protected from the implanting process. The source/drain structure 1502 may have an impurity (e.g., dopant) concentration in a range from about $1\times10^{19}$ $cm^{-3}$ to about $1\times10^{21}$ $cm^{-3}$. P-type impurities, such as boron or indium, may be implanted in the source/drain structure 1502 of a P-type transistor. N-type impurities, such as phosphorous or arsenide, may be implanted in the source/drain structure 1502 of an N-type transistor. In some embodiments, the epitaxial source/drain regions may be in situ doped during growth.

Following the formation of the source/drain structure(s) 1502, an interlayer dielectric (ILD) 1550 is formed to overlay the source/drain structure(s) 1502. In some embodiments, the ILD 1550 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, a planarization process, such as a CMP process, may be performed to achieve a level (e.g., coplanar) top surface for the ILD 1550, top gate spacer 1202, sacrificial gate spacer 1102, bottom gate spacer 702, and dummy gate structure 602.

Figure 16:
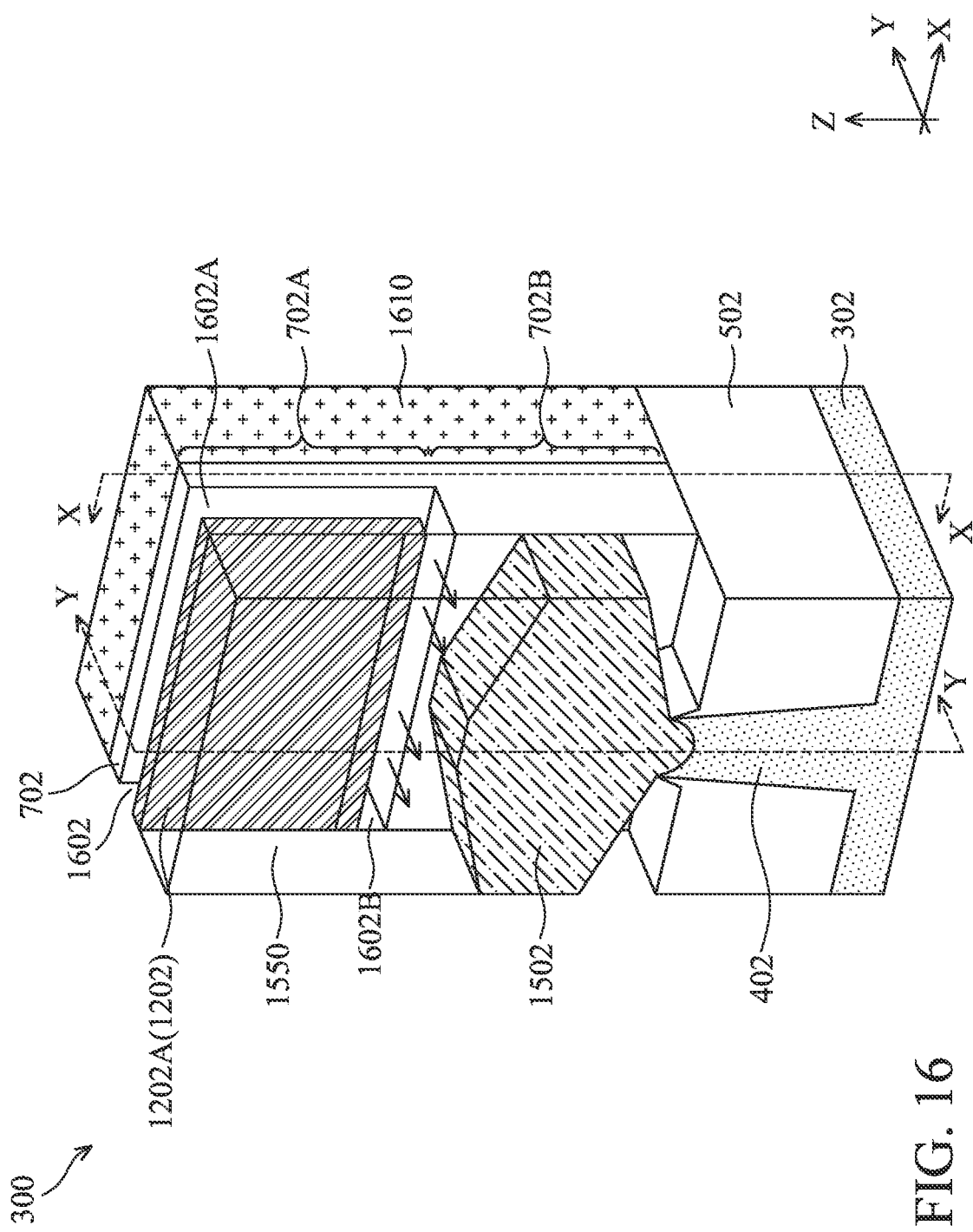

Corresponding to operation 220 of FIG. 2, FIG. 16 is a perspective view of the non-planar transistor device 300 including an air gap 1602 at one of the various stages of fabrication, in accordance with various embodiments. It should be noted that, for purposes of clarity, only a half of the non-planar transistor device 300 (e.g., a half of the semiconductor fin 402 that is disposed on one side of the dummy gate structure 602) is shown in FIG. 16. Thus, on the other side of the dummy gate structure 602 (along the Y axis), the non-planar transistor device 300 can include another air gap 1602.

In some embodiments, the air gap 1602 can be formed by selectively etching the sacrificial gate spacer 1102 (FIG. 15), while leaving the bottom gate spacer 702 and the top gate spacer 1202 substantially intact. The etching process can include a plasma ashing process (e.g., when the sacrificial gate spacer 1102 includes carbon), a wet etching process, or combinations thereof. For example, when the bottom gate spacer 702 and top gate spacer 1202 are formed of SiOCN, the sacrificial gate spacer 1102 is formed of SiN, the etching process may include an etchant of $H_3PO_4$. However, it should be understood that the etching process can include any of various etchants that has an etching selectivity between the bottom gate spacer 702 and the sacrificial gate spacer 1102 and between the top gate spacer 1202 and the sacrificial gate spacer 1102, while remaining within the scope of the present disclosure.

As such, the air gap 1602 can inherit the L-shaped profile of the sacrificial gate spacer 1102. In other words, the air gap 1602 includes a vertically extending portion 1602A and a laterally extending portion 1602B. The vertical portion 1602A is laterally sandwiched between the vertical portion of the top gate spacer 1202A and the upper portion of the bottom gate spacer 702A. Further, the vertical portion 1602A has a bottom end separated away from the top surface of the semiconductor fin 402 with the bottom gate spacer 702 (e.g., the lower portion 702B), in accordance with various embodiments. The lateral portion 1602B is vertically sandwiched between the vertical portion of the top gate spacer 1202A and the lower portion of the bottom gate spacer 702B. In some other embodiments, the air gap 1602 may only have the vertical portion (i.e., no lateral portion), or a majority portion of the sacrificial gate spacer 1102 that extends laterally still remains.

By lifting the sacrificial gate spacer 1102 away from the source/drain structure 1502 with the bottom gate spacer 702 (e.g., a portion of the lower portion 702B that is disposed above the source/drain structure 1502), etchants used to remove the sacrificial gate spacer 1102 (indicated by the arrows of FIG. 16) can be avoided from directly reaching (e.g., damaging) the source/drain structure 1502.

The air gap 1602 may include air or other gases, including gases present during deposition of the insulation material of the sacrificial gate spacer 1102, such as oxygen, nitrogen, argon, hydrogen, helium, xenon, as well as mixtures thereof. A gas pressure within the air gap 1602 may be atmospheric pressure. Alternatively, the gas pressure within the air gap 1602 may be greater than or less than the atmospheric pressure.

Next, the dummy gate structure 602 (FIG. 15) is replaced with an active (e.g., metal) gate structure 1610. The metal gate structure 1610 can include a gate dielectric layer, a metal gate layer, and one or more other layers. For example, the metal gate structure 1610 may further include a capping layer and a glue layer. The capping layer can protect the underlying work function layer from being oxidized. In some embodiments, the capping layer may be a silicon-containing layer, such as a layer of silicon, a layer of silicon oxide, or a layer of silicon nitride. The glue layer can function as an adhesion layer between the underlying layer and a subsequently formed gate electrode material (e.g., tungsten) over the glue layer. The glue layer may be formed of a suitable material, such as titanium nitride.

The gate dielectric layer is formed in a corresponding gate trench to straddle a portion of the semiconductor fin 402 (e.g., a channel structure of the non-planar transistor device 300). In an embodiment, the gate dielectric layer can be the remaining portion of a dummy gate dielectric of the dummy gate structure. In another embodiment, the gate dielectric layer can be formed by removing the dummy gate dielectric, followed by conformal deposition or thermal reaction. In yet another embodiment, the gate dielectric layer can be formed by removing the dummy gate dielectric, followed by no further processing step (i.e., the gate dielectric layer may be a native oxide).

The gate dielectric layer includes silicon oxide, silicon nitride, or multilayers thereof. In example embodiments, the gate dielectric layer includes a high-k dielectric material, and in these embodiments, the gate dielectric layer may have a k value greater than about 7.0, and may include a metal oxide or a silicate of Hf, Al, Zr, La, Mg, Ba, Ti, Pb, or combinations thereof. The formation methods of gate dielectric layer may include molecular beam deposition (MBD), atomic layer deposition (ALD), PECVD, and the like. A thickness of the gate dielectric layer may be between about 8 angstroms (Å) and about 20 Å, as an example.

The metal gate layer is formed over the gate dielectric layer. The metal gate layer may be a P-type work function layer, an N-type work function layer, multi-layers thereof, or combinations thereof, in some embodiments. Accordingly, the metal gate layer is sometimes referred to as a work function layer. For example, the metal gate layer may be an N-type work function layer. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, WN, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof.

A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. The thickness of a P-type work function layer may be between about 8 Å and about 15 Å, and the thickness of an N-type work function layer may be between about 15 Å and about 30 Å, as an example.

FIGS. 17A-B, 18A-B, 19A-B, and 20A-B illustrate cross-sectional views of various embodiments of the non-planar transistor device 300 discussed above. The views of non-planar transistor device 300 in FIGS. 17A, 18A, 19A, and 20A are cut along cross-section Y-Y (as indicated in FIG. 16). The cross-section Y-Y may extend along the lengthwise direction of the semiconductor fin 402 (but not across the source/drain structure 1502). The views of non-planar transistor device 300 in FIGS. 17B, 18B, 19B, and 20B are cut along cross-section X-X (as indicated in FIG. 16). The cross-section X-X may extend across a bottom gate spacer (or one of its layers) disposed immediately next to the air gap 1602.

In particular, the non-planar transistor device 300 in FIGS. 17A-B includes the bottom gate spacer 702 shown in FIG. 7; the non-planar transistor device 300 in FIGS. 18A-B includes the bottom gate spacer 802 shown in FIG. 8; the non-planar transistor device 300 in FIGS. 19A-B includes the bottom gate spacer 902 shown in FIG. 9; and the non-planar transistor device 300 in FIGS. 20A-B includes the bottom gate spacer 1002 shown in FIG. 10.

As illustrated in FIGS. 17A-B, the bottom gate spacer 702, which is formed as a single layer having an L-shaped profile that overlays the top surface and sidewalls of the semiconductor fin 402, while the top gate spacer 1202 (formed in an I-shaped profile) that contacts the L-shaped air gap 1602. The above-mentioned critical dimension, $CD_A$, may be defined by the single layer of gate spacer 702, in some embodiments.

As illustrated in FIGS. 18A-B, the bottom gate spacer 802, which is formed as a stack of layers 804 and 806 collectively having an L-shaped profile, while the top gate spacer 1202 (formed in an I-shaped profile) that contacts the L-shaped air gap 1602. The layers 804 and 806 can collectively overlay (e.g., contact) the top surface of the semiconductor fin 402. Further, above the top surface of the semiconductor fin 402, the layer 804 may have an I-shaped profile, and the layer 806 may have an L-shaped profile. The critical dimension, $CD_A$, may be defined by the layer 806 of gate spacer 802, in some embodiments.

As illustrated in FIGS. 19A-B, the bottom gate spacer 902, which is formed as a stack of layers 904 and 906 collectively having an L-shaped profile, while the top gate spacer 1202 (formed in an I-shaped profile) that contacts the L-shaped air gap 1602. The layers 904 and 906 can collectively overlay (e.g., contact) the top surface of the semiconductor fin 402. Further, above the top surface of the semiconductor fin 402, the layer 904 may have an I-shaped profile, and the layer 906 may have an I-shaped profile rotated 90 degrees. As such, a sidewall of the air gap 1602 may be misaligned with a junction between the layers 904 and 906. The critical dimension, $CD_A$, may be defined by the layer 906 of gate spacer 902, in some embodiments.

As illustrated in FIGS. 20A-B, the bottom gate spacer 1002, which is formed as a stack of layers 1004 and 1006 collectively having an L-shaped profile, while the top gate spacer 1202 (formed in an I-shaped profile) that contacts the L-shaped air gap 1602. The layers 1004 and 1006 can collectively overlay (e.g., contact) the top surface of the semiconductor fin 402. Further, above the top surface of the semiconductor fin 402, the layer 1004 may have an I-shaped profile, and the layer 1006 may also have an I-shaped profile. As such, a sidewall of the air gap 1602 may be aligned with a junction between the layers 1004 and 1006. The critical dimension, $CD_A$, may be defined by the layer 1006 of gate spacer 1002, in some embodiments.

FIGS. 21A-B, 22A-B, 23A-B, 24A-B, and 25A-B illustrate cross-sectional views of various further embodiments of the non-planar transistor device 300, in which a bottom gate spacer includes three layers. Similarly, FIGS. 21A, 22A, 23A, 24A, and 25A illustrate the views of FinFET deice 300 cut along cross-section Y-Y (FIG. 16); and FIGS. 21B, 22B, 23B, 24B, and 25B illustrate the views of FinFET deice 300 cut along cross-section X-X (FIG. 16).

Figures 25A, 25B:
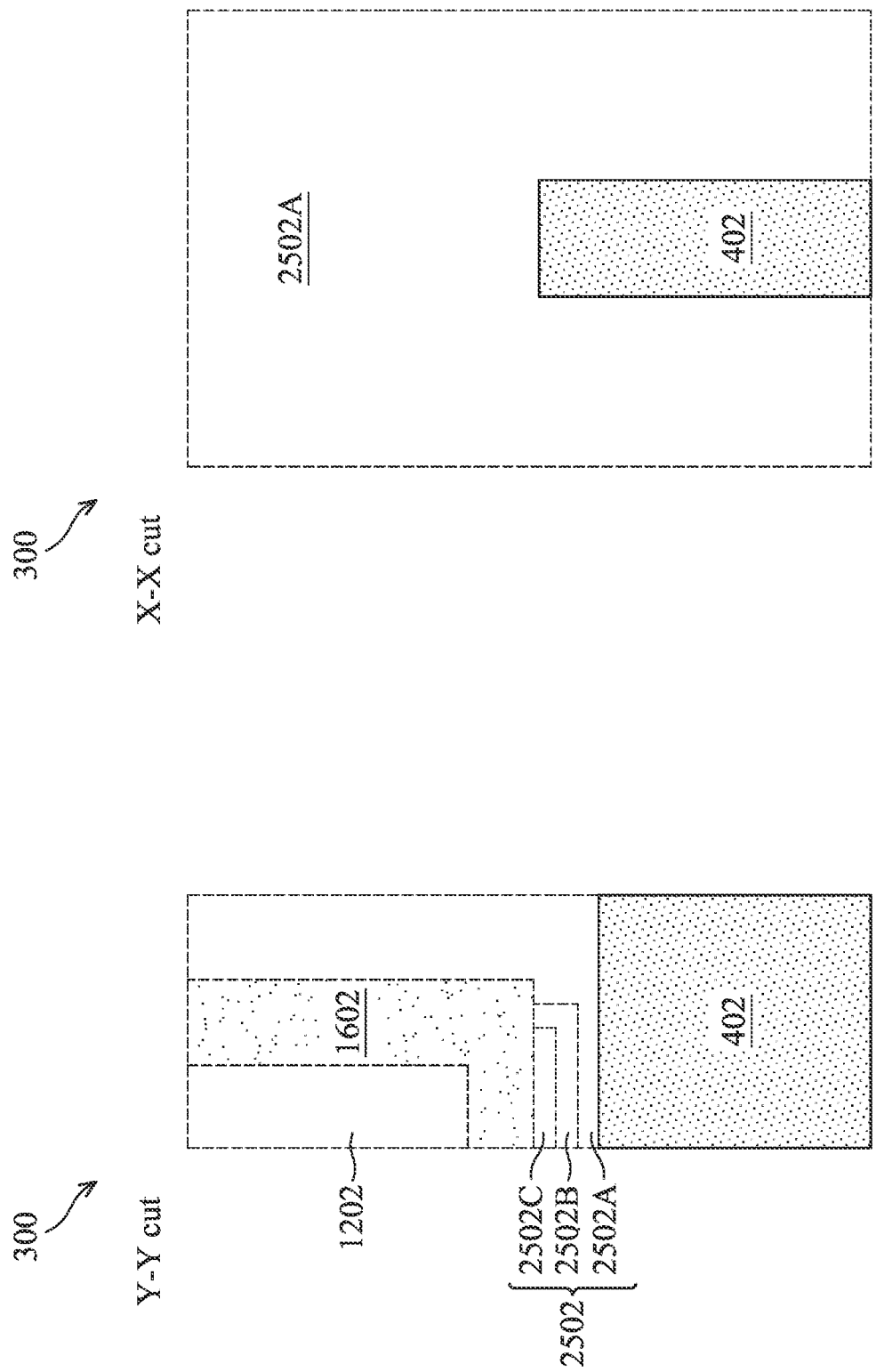

In FIGS. 21A-B, the non-planar transistor device 300 includes a bottom gate spacer 2102 having layers 2102A, 2102B, and 2102C. Each of the layer 2102A to 2102C can have an L-shaped profile. In FIGS. 22A-B, the non-planar transistor device 300 includes a bottom gate spacer 2202 having layers 2202A, 2202B, and 2202C. The layer 2202A and 2202B can each have an L-shaped profile, and the layer 2202C can have an I-shaped profile rotated 90 degrees. In FIGS. 23A-B, the non-planar transistor device 300 includes a bottom gate spacer 2302 having layers 2302A, 2302B, and 2302C. The layer 2302A can have an L-shaped profile, the layer 2302B can have a W-shaped profile, and the layer 2302C can have an I-shaped profile rotated 90 degrees. In FIGS. 24A-B, the non-planar transistor device 300 includes a bottom gate spacer 2402 having layers 2402A, 2402B, and 2402C. The layer 2402A and 2402B can each have an L-shaped profile, and the layer 2402C can have an I-shaped profile rotated 90 degrees. In FIGS. 25A-B, the non-planar transistor device 300 includes a bottom gate spacer 2502 having layers 2502A, 2502B, and 2502C. The layer 2502A can have a W-shaped profile, and the layer 2502B can have an L-shaped profile, and the layer 2502C can have an I-shaped profile rotated 90 degrees.

Figure 26:
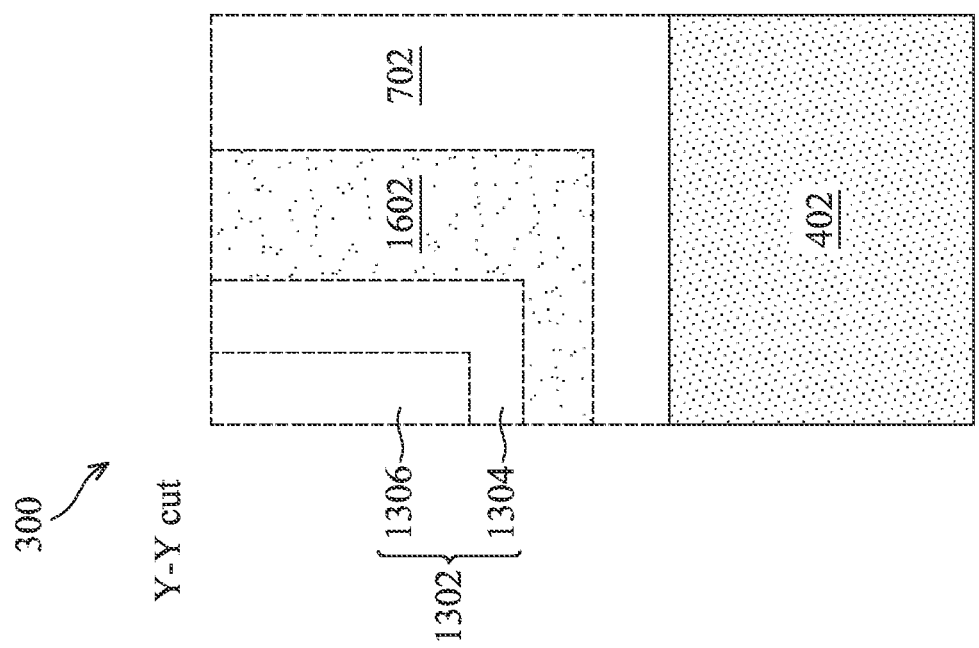
FIG. 26 illustrates a cross-sectional view of various embodiments of the example non-planar transistor device, made by the method of FIG. 2, in accordance with some embodiments.

FIG. 26 illustrates a cross-sectional view of various embodiments of the non-planar transistor device 300 discussed above. The views of non-planar transistor device 300 in FIG. 26 is cut along cross-section Y-Y (as indicated in FIG. 16). In particular, the non-planar transistor device 300 in FIG. 26 includes the top gate spacer 1302 that includes the layers 1304 and 1306 (FIG. 13). As shown in FIG. 26, upon the air gap 1602 being formed, the layer 1304 can have an L-shaped profile, and the layer 1306 can have an I-shaped profile. Alternatively, the layer 1306 can also have an L-shaped profile, depending on how much the fin 402 is etched to epitaxially grow a source/drain structure.

Although the etchants to remove the sacrificial gate spacer 1102 can leave the bottom gate spacer and top gate spacer substantially intact (as discussed above), in some scenarios, portions of the bottom and top gate spacers can still be consumed by the etchants. As such, the air gap 1602 may expand the dimension and profile of the sacrificial gate spacer 1102. FIGS. 27A-B and 28A-B respectively illustrate examples where the profile of air gap 1602 has been changed from the profile of the sacrificial gate spacer 1102. FIGS. 27A-28B each illustrate a cross-sectional view of the non-planar transistor device 300 cut along cross-section Y-Y (FIG. 16).

Figures 27A, 27B:
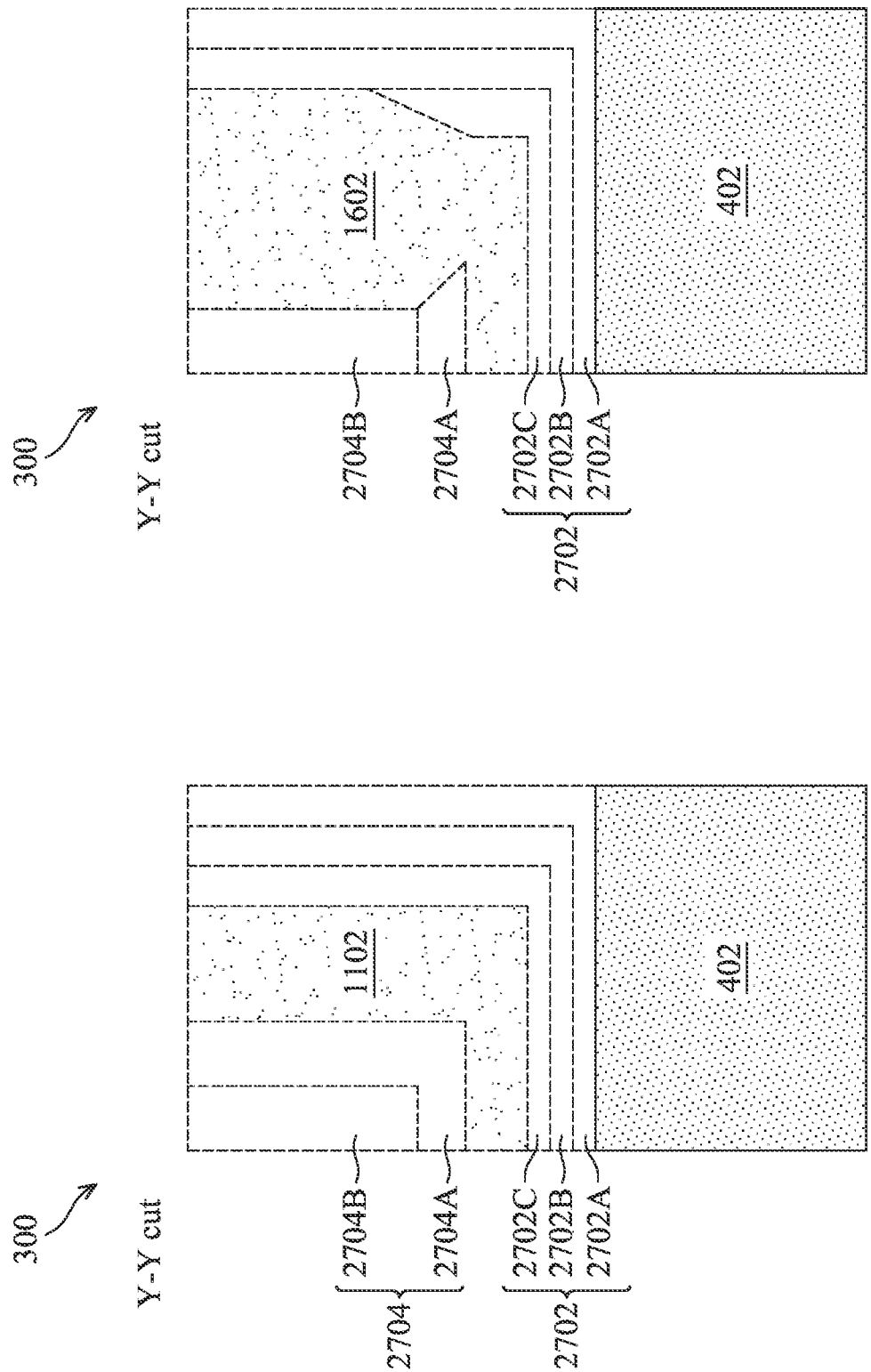
FIGS. 27A-B illustrate cross-sectional views of the example non-planar transistor device, prior to and subsequently to forming an air gap, respectively, in accordance with some embodiments.

In FIGS. 27A-B, the sacrificial gate spacer 1102 is sandwiched by a bottom gate spacer 2702 that includes layers 2702A, 2702B and 2702C, and a top gate spacer 2704 that includes layers 2704A and 2704B. Upon the air gap 1602 being formed (by removing the sacrificial gate spacer 1102), a portion of the layer 2702C of the bottom gate spacer and a portion of the layer 2704A of the top gate spacer are consumed, which causes the profile of air gap 1602 to expand from the profile of the sacrificial gate spacer 1102. In FIG. 28A-B, the sacrificial gate spacer 1102 is sandwiched by a bottom gate spacer 2802 that includes a single layer, and a top gate spacer 2804 that includes layers 2804A and 2804B. Upon the air gap 1602 being formed (by removing the sacrificial gate spacer 1102), a portion of the layer 2804A of the top gate spacer is consumed, which causes the profile of air gap 1602 to expand from the profile of the sacrificial gate spacer 1102.

As mentioned above, at least some of the operations of the disclosed method 200 can also be used to make a GAA transistor device. FIG. 29 depicts a cross-sectional view of the non-planar transistor device 300 that is fabricated as a GAA transistor device. The cross-sectional view of the non-planar transistor device 300 in FIG. 29 is cut along cross-section Y-Y (FIG. 16). As shown, the channel structure of the non-planar transistor device 300 includes a stack of semiconductor layers 2902 (e.g., nanosheets, nanowires, or otherwise nanostructures). The semiconductor layers 2902 are vertically separated from each other. The non-planar transistor device 300 includes a metal gate structure 2906 wraps around each of the semiconductor layers 2902. On opposite sides of (an upper portion of) the metal gate structure 2906, the non-planar transistor device 300 includes an air gap 2914 sandwiched a bottom gate spacer 2912 and a top gate spacer 2916, where the air gap 2914 is lifted above the topmost semiconductor layer 2902 with the bottom gate spacer 2912. Further, the non-planar transistor device 300 includes a number of inner spacers 2904, each of which is disposed between adjacent ones of the semiconductor layers 2902.

In one aspect of the present disclosure, a semiconductor device is disclosed. The semiconductor device includes a channel structure, extending along a first lateral direction, that is disposed over a substrate. The semiconductor device includes a gate structure, extending along a second lateral direction perpendicular to the first lateral direction, that straddles the channel structure. The semiconductor device includes an epitaxial structure, coupled to the channel structure, that is disposed next to the gate structure. The semiconductor device includes an air gap disposed between the gate structure and the epitaxial structure along the first lateral direction. The air gap comprises a first portion that extends along a vertical direction and has a bottom end disposed above a top surface of the channel structure.

In another aspect of the present disclosure, a semiconductor device is disclosed. The semiconductor device includes a gate structure extending along a first lateral direction. The semiconductor device includes a source/drain structure disposed on one side of the gate structure along a second lateral direction, the second lateral direction perpendicular to the first lateral direction. The semiconductor device includes an air gap disposed between the gate structure and the source/drain structure along the second lateral direction, wherein the air gap is disposed over the source/drain structure.

In yet another aspect of the present disclosure, a method for fabricating semiconductor devices is disclosed. The method includes forming a channel structure over a substrate, wherein the channel structure extends along a first lateral direction. The method includes forming a first gate spacer straddling a portion of the channel structure. The method includes forming a sacrificial gate spacer over the first gate spacer. The sacrificial gate spacer has a bottom surface vertically above a top surface of the channel structure. The method includes forming a second gate spacer over the sacrificial gate spacer. The method includes removing the sacrificial gate spacer to form an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
    forming a channel structure over a substrate and along a lateral direction;
    forming a gate structure along a second lateral direction, wherein the gate structure straddles a first portion of the channel structure;
    forming a gate spacer along a side of the gate structure, wherein the gate spacer has a lateral portion and a vertical portion;
    forming a sacrificial gate spacer over the gate spacer, wherein the sacrificial gate spacer covers both the lateral portion and the vertical portion;
    removing a second portion of the channel structure, wherein the second portion is adjacent to the first portion along the lateral direction, and wherein removing the second portion of the channel structure removes portions of the gate spacer and the sacrificial gate spacer;
    after removing the second portion of the channel structure, growing an epitaxial structure over a sidewall of a remaining portion of the channel structure; and
    removing a remaining portion of the sacrificial gate spacer to form an air gap that is entirely disposed between the gate spacer and the epitaxial structure along the lateral direction.

2. The method of claim 1, wherein the air gap is laterally separated from the gate structure by the vertical portion of the gate spacer.

3. The method of claim 1, wherein the air gap has an L-shaped profile.

4. The method of claim 1, wherein the gate spacer is formed entirely above the epitaxial structure by a dimension in a range from 0.3 nm to 20 nm.

5. The method of claim 4, wherein the range of the dimension is from 5 nm to 15 nm.

6. The method of claim 1, wherein:
    the lateral portion is a first lateral portion and the vertical portion is a first lateral portion, and
    the air gap has a second vertical portion interposed between the first vertical portion and a sidewall of the epitaxial structure, and a second lateral portion entirely disposed adjacent to a top surface of the epitaxial structure.

7. The method of claim 1, prior to removing the remaining portion of the sacrificial gate spacer, further comprising overlaying the epitaxial structure with a dielectric material.

8. The method of claim 1, wherein:
    the gate spacer is a first gate spacer, the lateral portion is a first lateral portion, and the vertical portion is a first vertical portion,
    the method further comprises forming a second gate spacer after forming the sacrificial gate spacer and prior to removing the portions of the semiconductor fin, the gate spacer, and the sacrificial gate spacer, and
    the second gate spacer has a second lateral portion and a second vertical portion over the first lateral portion and the first vertical portion, respectively.

9. The method of claim 8, wherein removing the portions of the semiconductor fin, the gate spacer, and the sacrificial gate spacer removes an entirety of the second lateral portion.

10. The method of claim 7, wherein the air gap exposes a portion of the dielectric material.

11. A method for fabricating semiconductor devices, comprising:
  forming a channel structure over a substrate and along a lateral direction;
  forming a dummy gate structure extending along a second lateral direction and straddling a first portion of the channel structure;
  forming a gate spacer along a side of the dummy gate structure, wherein the gate spacer has a first bottom portion extending away from the dummy gate structure over a second portion of the channel structure along the lateral direction;
  forming a sacrificial gate spacer over an entirety of the gate spacer;
  recessing the second portion of the channel structure and portions of the sacrificial gate spacer and the gate spacer disposed over the second portion;
  growing an epitaxial structure over a sidewall of the recessed channel structure; and
  forming an air gap to replace remaining portions of the sacrificial gate spacer, wherein an entirety of the air gap is vertically above the epitaxial structure and between the dummy gate structure along the lateral direction.

12. The method of claim 11, wherein the entirety of the air gap is vertically separated from the epitaxial structure by the bottom portion of the gate spacer.

13. The method of claim 11, further comprising:
  forming an interlayer dielectric (ILD) layer over the epitaxial structure prior to forming the air gap; and
  replacing the dummy gate structure with a metal gate structure after forming the ILD layer.

14. The method of claim 11, wherein the gate spacer is formed entirely above the epitaxial structure by a dimension in a range from 0.3 nm to 20 nm.

15. The method of claim 11, wherein the air gap has an L-shaped profile.

16. The method of claim 13, wherein:
  the air gap has a second bottom portion extending over the first bottom portion, and
  the ILD layer extends over the second bottom portion of the air gap along a vertical direction.

17. The method of claim 11, wherein:
  the gate spacer is a first gate spacer, and
  the method further comprises forming a second gate spacer over the entirety of the sacrificial gate spacer prior to recessing the portions of the sacrificial gate spacer and the gate spacer.

18. A method for fabricating semiconductor devices, comprising:
  forming a channel structure over a substrate and along a lateral direction;
  forming a first gate spacer straddling a first portion of the channel structure, wherein the first gate spacer has a bottom portion that fills a space surrounding a second portion of the channel structure, and wherein the second portion is adjacent to the first portion along the lateral direction;
  forming a sacrificial gate spacer over the first gate spacer, wherein sidewalls of the second portion of the channel structure are free of any portions of the sacrificial gate spacer;
  forming a second gate spacer over the sacrificial gate spacer;
  removing the second portion of the channel structure, the bottom portion of the gate spacer, and a bottom portion of the sacrificial gate spacer to expose a sidewall of the first portion of the channel structure;
  forming an epitaxial structure over the exposed sidewall of the channel structure, wherein a top surface of the epitaxial structure is below a remaining portion of the gate spacer; and
  after forming the epitaxial structure, removing the sacrificial gate spacer to form an air gap, wherein the air gap is entirely above the channel structure.

19. The method of claim 18, prior to removing the sacrificial gate spacer, further comprising overlaying the epitaxial structure with a dielectric material, wherein the dielectric material extends over a bottom portion of the air gap.

20. The method of claim 18, wherein air gap is vertically above the epitaxial structure by a dimension in a range from 0.3 nm to 20 nm.

* * * * *